United States Patent
Olsson et al.

(10) Patent No.: US 11,187,761 B1
(45) Date of Patent: Nov. 30, 2021

(54) THREE-AXIS MEASUREMENT MODULES AND SENSING METHODS

(71) Applicant: SeeScan, Inc., San Diego, CA (US)

(72) Inventors: Mark S. Olsson, La Jolla, CA (US); Allen P. Hoover, San Diego, CA (US); Sequoyah Aldridge, San Diego, CA (US); Stephanie M. Bench, Carlsbad, CA (US)

(73) Assignee: SEESCAN, INC., San Diego, CA (US)

( * ) Notice: Subject to any disclaimer, the term of this patent is extended or adjusted under 35 U.S.C. 154(b) by 0 days.

(21) Appl. No.: 16/178,494

(22) Filed: Nov. 1, 2018

Related U.S. Application Data

(60) Provisional application No. 62/580,386, filed on Nov. 1, 2017.

(51) Int. Cl.
| | |
|---|---|
| *G01V 3/00* | (2006.01) |
| *G01R 33/02* | (2006.01) |
| *G01R 33/00* | (2006.01) |
| *G01C 9/00* | (2006.01) |
| *G01P 15/18* | (2013.01) |
| *G01V 3/08* | (2006.01) |

(52) U.S. Cl.
CPC .......... *G01R 33/0206* (2013.01); *G01C 9/00* (2013.01); *G01P 15/18* (2013.01); *G01R 33/0082* (2013.01); *G01V 3/081* (2013.01)

(58) Field of Classification Search
CPC ............ G01R 33/0206; G01R 33/0082; G01R 33/10; G01R 33/096; G01R 33/07; G01V 3/081; G01V 3/16; G01V 3/165; G01V 3/17; G01V 3/38; G01C 21/16; G01C 21/165; G01C 19/62; G01C 17/28; G01C 17/30; G01C 17/38
See application file for complete search history.

(56) References Cited

U.S. PATENT DOCUMENTS

| | | | | |
|---|---|---|---|---|
| 6,115,261 | A * | 9/2000 | Platt ...................... | H05K 3/301 200/61.45 R |
| 7,420,364 | B2 * | 9/2008 | Honkura ................. | G01C 9/06 324/244 |
| 8,106,660 | B1 * | 1/2012 | Merewether ........... | G01V 3/165 324/326 |
| 9,927,545 | B2 * | 3/2018 | Olsson .................... | G01V 3/08 |
| 10,082,599 | B1 * | 9/2018 | Olsson .................... | G01V 11/00 |
| 2005/0270020 | A1 * | 12/2005 | Peczalski ............... | B82Y 25/00 324/247 |
| 2007/0030600 | A1 * | 2/2007 | Shoji ...................... | G01P 15/105 360/274 |
| 2008/0052932 | A1 * | 3/2008 | Xue ........................ | G01C 17/28 33/356 |
| 2011/0181290 | A1 * | 7/2011 | Kuzmin .................. | G01V 3/17 324/331 |

(Continued)

OTHER PUBLICATIONS

Tumanski, Slawomir et al, "Magnetic Sensor Array for Investigations of Magnetic Field Distribution," Journal of Electrical Engineering, Nov. 28, 2006, pp. 185-188, vol. 57, No. 8/S, Warsaw University of Technology.

*Primary Examiner* — Thang X Le
(74) *Attorney, Agent, or Firm* — Michael J. Pennington, Esq.; Steven C. Tietsworth, Esq.

(57) ABSTRACT

Sensor modules for measuring parameters such as magnetic fields, tilts, orientation, or other parameters in high resolution in three orthogonal axes using single-axis sensor arrays are disclosed.

18 Claims, 22 Drawing Sheets

(56) References Cited

U.S. PATENT DOCUMENTS

| | | | |
|---|---|---|---|
| 2013/0147467 A1* | 6/2013 | Engel | G01B 7/012 |
| | | | 324/207.12 |
| 2013/0293233 A1* | 11/2013 | Cole | G01V 3/30 |
| | | | 324/344 |
| 2015/0285873 A1* | 10/2015 | Cai | G01R 33/0005 |
| | | | 324/252 |
| 2015/0338539 A1* | 11/2015 | Olsson | G01V 3/165 |
| | | | 324/326 |
| 2016/0047675 A1* | 2/2016 | Tanenhaus | G01C 25/005 |
| | | | 702/104 |
| 2018/0210039 A1* | 7/2018 | Shalev | G01V 3/165 |

* cited by examiner

THREE-AXIS MEASUREMENT MODULES AND SENSING METHODS

CROSS-REFERENCE TO RELATED APPLICATIONS

This application claims priority to U.S. Provisional Patent Application Ser. No. 62/580,386, filed Nov. 1, 2017, entitled THREE-AXIS MEASUREMENT MODULES AND SENSING METHODS, the content of which is incorporated by reference herein in its entirety for all purposes.

FIELD

This disclosure relates generally to measurement modules for use in sensing parameters in three orthogonal spatial axes. More specifically, but not exclusively, this disclosure relates to measurement modules with an array of single-axis sensors positioned in a predefined three dimensional orientation to sense targeted parameters in three dimensions.

BACKGROUND

Devices and sensor modules for generating measurements along three orthogonal axes are known in the art. Examples include accelerometers, gyroscopes, magnetometers, compass sensors, and the like. These sensors may measure and provide corresponding data outputs corresponding to accelerations, orientations, magnetic forces such as the Earth's magnetic forces, relative direction, as well as other parameters.

In some precision applications, such as with inertial navigation systems (INS) and motion tracking systems, high resolution measurements in three-dimensional space may be required. Traditionally, measurement of parameters such as force or magnetic fields in three dimensions is done using a stand-alone multi-axis sensor device (e.g., a single integrated circuit chip that senses the parameters in multiple dimensions). However, current stand-alone multi-axis sensor chips for measuring parameters in three dimensions lack the precision and/or resolution required for many sensing applications. Moreover, while some existing single-axis sensors provide high resolution, they fall short in optimizing three-axis measurements in applications where multiple single-axis sensors are used in combination for making multi-axis measurements.

In systems using multiple sensors for measuring along three orthogonal axes, individual sensors are typically located on the same physical plane of an associated printed circuit board (PCB). For example, a multi-sensor device may have one sensor dedicated to measuring along a vertical axis (e.g., Z-axis normal to a plane of interest) and either a two-axis sensor (for sensing in X and Y axes), or two single axis sensors for measuring along each of the horizontal axes (e.g., X and Y axes on the plane of interest). This type of sensor configuration can result in unnecessary and suboptimal spacing between sensors, with potential measurement inaccuracies. Likewise, such sensor layouts may require different makes and/or models of sensors that may have differences in resolution. Further, the individual sensors may also be affected by different temperature variations depending on the individual device characteristics, placement, and other parameters. These differences may affect the performance and accuracy of each sensor differently, ultimately resulting in suboptimal three dimensional measurements.

Accordingly, there is a need in the art to address the above-described as well as other problems related to multi-axis sensing.

SUMMARY

The present disclosure relates generally to three-axis measurement devices and modules. More specifically, but not exclusively, this disclosure relates to three-axis measurement devices and modules using an array of single axis sensors in a pre-defined arrangement.

Embodiments of three-axis measurement modules in keeping with the present disclosure may include a mounting element that retains an array of single axis sensors. The single-axis sensors may be of the same make and model to reduce variances in resolution and temperature sensitivity. Each sensor may be retained in an orientation angled away from a common mounting plane such that each sensor may measure along one axis orthogonal to the measurement axes of the other sensors. Each measurement axis may intersect the other two axes at a common intersection point or small area or volume in three-dimensional space.

Various additional aspects, features, and functionality are further described below in conjunction with the appended Drawings.

BRIEF DESCRIPTION OF THE DRAWINGS

The present application may be more fully appreciated in connection with the following detailed description taken in conjunction with the accompanying drawings, wherein.

DETAILED DESCRIPTION OF EMBODIMENTS

Overview

Figure 1A:
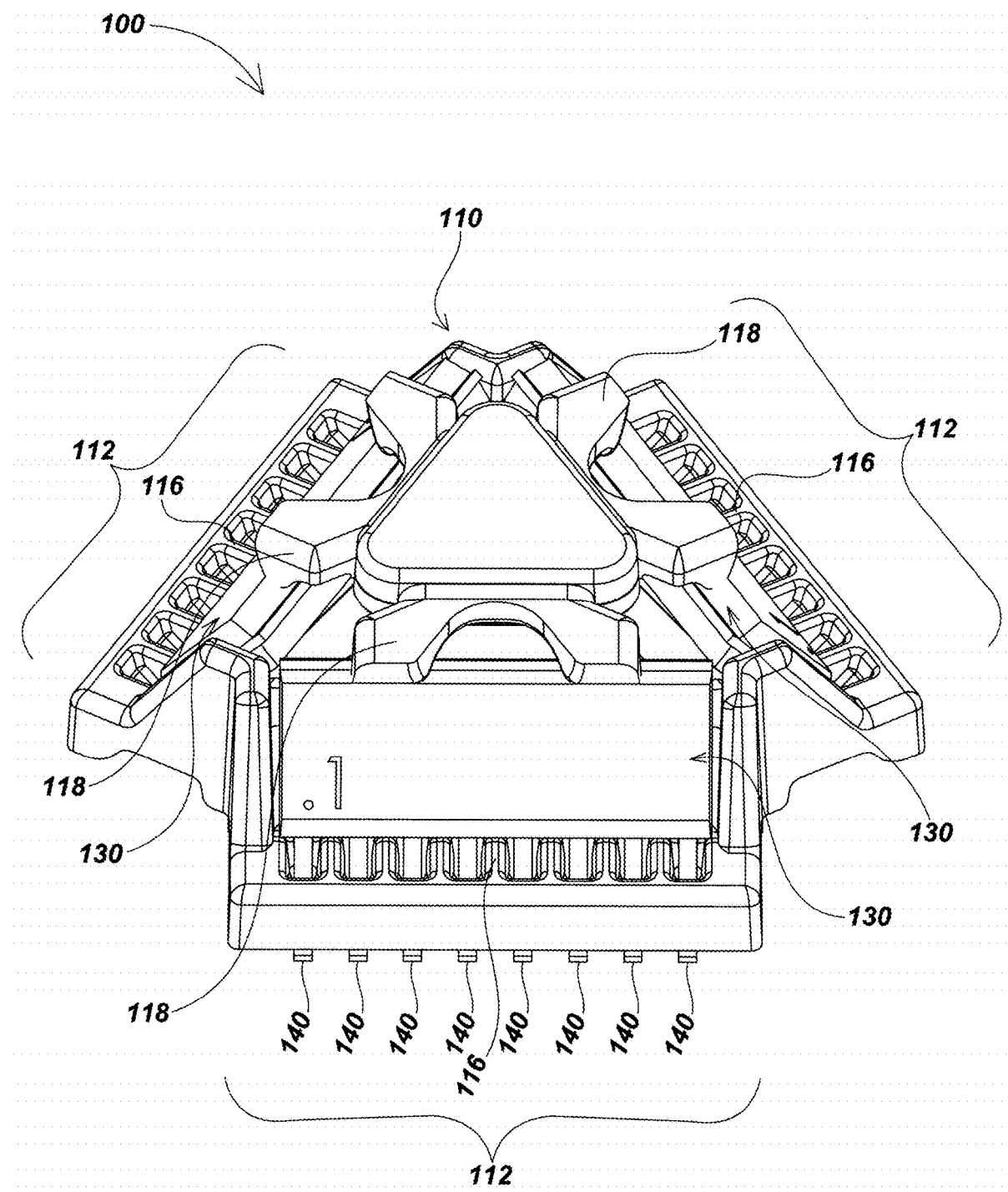
FIG. 1A is a top down isometric view of a three-axis measurement module embodiment.

The present disclosure relates generally to measurement modules for high precision measurement in multiple axes. More specifically, but not exclusively, this disclosure relates to three-axis measurement devices and modules using an array of single axis sensors.

Various aspects of the disclosures herein may be included in various embodiments of other devices and systems in the electronics, test and measurement, metrology, and other fields where multi-axis sensors are used.

In some embodiments, the modules and related aspects described herein may be included in devices such as utility locators, inspection cameras, and related equipment used with these devices and systems. For example, the modules and related aspects herein may be combined in embodiments with various aspects of the disclosures in Applicant's co-assigned patents and patent applications, including video inspection devices, utility transmitter and locator devices and associated apparatus, systems, and methods, such as are described in U.S. Pat. No. 6,545,704, issued Apr. 7, 1999, entitled VIDEO PIPE INSPECTION DISTANCE MEASURING SYSTEM; U.S. Pat. No. 6,831,679, issued Dec. 14, 2004, entitled VIDEO CAMERA HEAD WITH THERMAL FEEDBACK LIGHTING CONTROL; U.S. Pat. No. 6,958,767, issued Oct. 25, 2005, entitled VIDEO PIPE INSPECTION SYSTEM EMPLOYING NON-ROTATING CABLE STORAGE DRUM; U.S. Pat. No. 7,009,399, issued Mar. 7, 2006, entitled OMNIDIRECTIONAL SONDE AND LINE LOCATOR; U.S. Pat. No. 7,221,136, issued May 22, 2007, entitled SONDES FOR LOCATING UNDERGROUND PIPES AND CONDUITS; U.S. Pat. No. 7,288,929, issued Oct. 30, 2007, entitled INDUCTIVE CLAMP FOR APPLYING SIGNAL TO BURIED UTILITIES; U.S. Pat. No. 7,298,126, issued Nov. 20, 2007, entitled SONDES FOR LOCATING UNDERGROUND PIPES AND CONDUITS; U.S. Pat. No. 7,332,901, issued Feb. 19, 2008, entitled LOCATOR WITH APPARENT DEPTH INDICATION; U.S. Pat. No. 7,336,078, issued Feb. 26, 2008, entitled MULTI-SENSOR MAPPING OMNIDIRECTIONAL SONDE AND LINE LOCATORS; U.S. Pat. No. 7,498,797, issued Mar. 3, 2009, entitled LOCATOR WITH CURRENT-MEASURING CAPABILITY; U.S. Pat. No. 7,498,816, issued Mar. 3, 2009, entitled OMNIDIRECTIONAL SONDE AND LINE LOCATOR; U.S. Pat. No. 7,518,374, issued Apr. 14, 2009, entitled RECONFIGURABLE PORTABLE LOCATOR EMPLOYING MULTIPLE SENSOR ARRAYS HAVING FLEXIBLE NESTED ORTHOGONAL ANTENNAS; U.S. Pat. No. 7,557,559, issued Jul. 7, 2009, entitled COMPACT LINE ILLUMINATOR FOR LOCATING BURIED PIPES AND CABLES; U.S. Pat. No. 7,619,516, issued Nov. 17, 2009, entitled SINGLE AND MULTI-TRACE OMNIDIRECTIONAL SONDE AND LINE LOCATORS AND TRANSMITTER USED THEREWITH; U.S. patent application Ser. No. 12/704,808, filed Feb. 12, 2010, entitled PIPE INSPECTION SYSTEM WITH REPLACEABLE CABLE STORAGE DRUM; U.S. Pat. No. 7,733,077, issued Jun. 8, 2010, entitled MULTI-SENSOR MAPPING OMNIDIRECTIONAL SONDE AND LINE LOCATORS AND TRANSMITTER USED THEREWITH; U.S. Pat. No. 7,741,848, issued Jun. 22, 2010, entitled ADAPTIVE MULTICHANNEL LOCATOR SYSTEM FOR MULTIPLE PROXIMITY DETECTION; U.S. Pat. No. 7,825,647, issued Nov. 2, 2010, entitled METHOD FOR LOCATING BURIED PIPES AND CABLES; U.S. Pat. No. 7,863,885, issued Jan. 4, 2011, entitled SONDES FOR LOCATING UNDERGROUND PIPES AND CONDUITS; U.S. patent application Ser. No. 13/189,844, filed Jul. 25, 2011, entitled BURIED OBJECT LOCATOR SYSTEMS AND METHODS; U.S. Pat. No. 7,990,151, issued Aug. 2, 2011, entitled TRI-POD BURIED LOCATOR SYSTEM; U.S. patent application Ser. No. 13/346,668, Jan. 9, 2012, entitled PORTABLE CAMERA CONTROLLER PLATFORM FOR USE WITH PIPE INSPECTION SYSTEM; U.S. Pat. No. 8,106,660, issued Jan. 31, 2012, entitled SONDE ARRAY FOR USE WITH BURIED LINE LOCATOR; U.S. patent application Ser. No. 13/584,799, filed Aug. 13, 2012, entitled BURIED OBJECT LOCATOR SYSTEMS AND METHODS; U.S. Pat. No. 8,248,056, issued Aug. 21, 2012, entitled A BURIED OBJECT LOCATOR SYSTEM EMPLOYING AUTOMATED VIRTUAL DEPTH EVENT DETECTION AND SIGNALING; U.S. Pat. No. 8,264,226, issued Sep. 11, 2012, entitled SYSTEMS AND METHODS FOR LOCATING BURIED PIPES AND CABLES WITH A MAN PORTABLE LOCATOR AND A TRANSMITTER IN A MESH NETWORK; U.S. patent application Ser. No. 13/647,310, filed Oct. 8, 2012, entitled PIPE INSPECTION SYSTEM APPARATUS AND METHODS; U.S. Pat. No. 8,289,385, issued Oct. 16, 2012, entitled PUSH-CABLE FOR PIPE INSPECTION SYSTEM; U.S. patent application Ser. No. 13/769,202, Feb. 15, 2013, entitled SMART PAINT STICK DEVICES AND METHODS; U.S. patent application Ser. No. 13/787,711, Mar. 6, 2013, entitled DUAL SENSED LOCATING SYSTEMS AND METHODS; U.S. Pat. No. 8,395,661, issued Mar. 12, 2013, entitled PIPE INSPECTION SYSTEM WITH SELECTIVE IMAGE CAPTURE; U.S. patent application Ser. No. 13/826,112, Mar. 14, 2013, entitled SYSTEMS AND METHODS INVOLVING A SMART CABLE STORAGE DRUM AND NETWORK NODE FOR TRANSMISSION OF DATA; U.S. patent application Ser. No. 13/851,951, Mar. 27, 2013, entitled DUAL ANTENNA SYSTEMS WITH VARIABLE POLARIZATION; U.S. patent application Ser. No. 13/894,038, May 14, 2013, entitled OMNI-INDUCER TRANSMITTING DEVICES AND METHODS; U.S. patent application Ser. No. 13/925,636, Jun. 24, 2013, entitled MODULAR BATTERY PACK APPARATUS, SYSTEMS, AND METHODS INCLUDING VIRAL DATA AND/OR CODE TRANSFER; U.S. Pat. No. 8,547,428, issued Oct. 1, 2013, entitled PIPE MAPPING SYSTEM; U.S. Pat. No. 8,564,295, issued Oct. 22, 2013, entitled METHOD FOR SIMULTANEOUSLY DETERMINING A PLURALITY OF DIFFERENT LOCATIONS OF THE BURIED OBJECTS AND SIMULTANEOUSLY INDICATING THE DIFFERENT LOCATIONS TO A USER; U.S. patent application Ser. No. 14/077,022, filed Nov. 11, 2013, entitled WEARABLE MAGNETIC FIELD UTILITY LOCATOR SYSTEM WITH SOUND FIELD GENERATION; U.S. Pat. No. 8,587,648, issued Nov. 19, 2013, entitled SELF-LEVELING CAMERA HEAD; U.S. patent application Ser. No. 14/136,104, Dec. 20, 2013, entitled ROTATING CONTACT ASSEMBLIES FOR SELF-LEVELING CAMERA HEADS; U.S. patent application Ser. No. 14/148,649, Jan. 6, 2014, entitled MAPPING LOCATING SYSTEMS AND METHODS; U.S. patent application Ser. No. 14/203,485, filed Mar. 10, 2014, entitled PIPE INSPECTION CABLE COUNTER AND OVERLAY MANAGEMENT SYSTEM; U.S. patent application Ser. No. 14/207,527, Mar. 12, 2014, entitled ROTATING CONTACT ASSEMBLIES FOR SELF-LEVELING CAMERA HEADS; U.S. patent application Ser. No. 14/207,502, Mar. 12, 2014, entitled GRADIENT ANTENNA COILS FOR USE IN LOCATING SYSTEMS; U.S. patent application Ser. No. 14/216,358, Mar. 17, 2014, entitled SMART CABLE STORAGE DRUM AND NETWORK NODE SYSTEM AND METHODS; U.S. Pat. No. 9,703,002, issued Jul. 13, 2014, entitled UTILITY LOCATOR SYSTEMS AND METHODS; U.S. patent application Ser. No. 14/446,145, Jul. 29, 2014, entitled UTILITY LOCATING SYSTEMS WITH MOBILE BASE STATION; U.S. patent application Ser. No. 14/935,878, Nov. 7, 2014, entitled INSPECTION CAMERA DEVICES AND METHODS WITH SELECTIVELY ILLUMINATED MULTISENSOR IMAGING; U.S. patent application Ser. No. 14/557,163, Dec. 1, 2014, entitled ASSYMETRIC DRAG FORCE BEARING; U.S. patent application Ser. No. 14/642,596, filed Mar. 9, 2015, entitled PIPE CLEARING CABLES AND APPARATUS; U.S. patent application Ser. No. 14/709,301, filed May 11, 2015, entitled PIPE MAPPING SYSTEMS AND METHODS; U.S. Pat. No. 9,041,794, issued May 26, 2015, entitled PIPE MAPPING SYSTEMS AND METHODS; U.S. Pat. No. 9,057,754, issued Jun. 16, 2015, entitled ECONOMICAL MAGNETIC LOCATOR APPARATUS AND METHOD; U.S. patent application Ser. No. 14/749,545, Jun. 24, 2015, entitled ADJUSTABLE VARIABLE RESOLUTION INSPECTION SYSTEMS AND METHODS; U.S. patent application Ser. No. 14/797,760, Jul. 13, 2015, entitled HAPTIC DIRECTIONAL FEEDBACK HANDLES FOR LOCATING DEVICES; U.S. patent application Ser. No. 14/798,177, filed Jul. 13, 2015, entitled MARKING PAINT APPLICATOR FOR USE WITH PORTABLE UTILITY LOCATOR; U.S. Pat. No. 9,081,109, issued Jul. 14, 2015, entitled GROUND-TRACKING DEVICES FOR USE WITH A MAPPING LOCATOR; U.S. Pat. No. 9,080,992, issued Jul. 14, 2015, entitled ADJUSTABLE VARIABLE RESOLUTION INSPECTION SYSTEMS AND METHODS; U.S. patent application Ser. No. 14/800,490, Jul. 15, 2013, entitled UTILITY LOCATOR DEVICES, SYSTEMS, AND METHODS WITH SATELLITE AND MAGNETIC FIELD SONDE ANTENNA SYSTEMS; U.S. Pat. No. 9,085,007, issued Jul. 21, 2015, entitled MARKING PAINT APPLICATOR FOR PORTABLE LOCATOR; U.S. Pat. No. 9,134,255, issued Sep. 15, 2015, entitled PIPE INSPECTION SYSTEM WITH SELECTIVE IMAGE CAPTURE; U.S. patent application Ser. No. 14/949,868, Nov. 23, 2015, entitled BURIED OBJECT LOCATORS WITH DODECAHEDRAL ANTENNA NODES; U.S. patent application Ser. No. 14/970,362, Dec. 15, 2015, entitled COAXIAL VIDEO PUSH-CABLES FOR USE IN INSPECTION SYSTEMS; U.S. Pat. No. 9,222,809, issued Dec. 29, 2015, entitled PORTABLE PIPE INSPECTION SYSTEMS AND APPARATUS; U.S. patent application Ser. No. 15/006,119, Jan. 26, 2016, entitled SELF-STANDING MULTI-LEG ATTACHMENT DEVICES FOR USE WITH UTILITY LOCATORS; U.S. patent application Ser. No. 15/434,056, Feb. 16, 2016, entitled BURIED UTILITY MARKER DEVICES, SYSTEMS, AND METHODS; U.S. Pat. No. 9,277,105, issued Mar. 1, 2016, entitled SELF-LEVELING CAMERA HEAD; U.S. Pat. No. 9,341,740, issued May 17, 2016, entitled OPTICAL GROUND TRACKING APPARATUS, SYSTEMS, AND METHODS; U.S. Pat. No. 9,372,117, issued Jun. 21, 2016, entitled OPTICAL GROUND TRACKING APPARATUS, SYSTEMS, AND METHODS; U.S. patent application Ser. No. 15/225,623, Aug. 1, 2016, entitled SONDE-BASED GROUND-TRACKING APPARATUS AND METHODS; U.S. patent application Ser. No. 15/225,721, filed Aug. 1, 2016, entitled SONDES AND METHODS FOR USE WITH BURIED LINE LOCATOR SYSTEMS; U.S. Pat. No. 9,411,066, issued Aug. 9, 2016, entitled SONDES AND METHODS FOR USE WITH BURIED LINE LOCATOR SYSTEMS; U.S. Pat. No. 9,411,067, issued Aug. 9, 2016, entitled GROUND-TRACKING SYSTEMS AND APPARATUS; U.S. patent application Ser. No. 15/247,503, Aug. 25, 2016, entitled LOCATING DEVICES, SYSTEMS, AND METHODS USING FREQUENCY SUITES FOR UTILITY DETECTION; U.S. Pat. No. 9,927,546, issued Aug. 29, 2016, entitled PHASE SYNCHRONIZED BURIED OBJECT LOCATOR APPARATUS, SYSTEMS, AND METHODS; U.S. Pat. No. 9,435,907, issued Sep. 6, 2016, entitled PHASE SYNCHRONIZED BURIED OBJECT LOCATOR APPARATUS, SYSTEMS, AND METHODS; U.S. Pat. No. 9,448,376, issued Sep. 20, 2016, entitled HIGH BANDWIDTH PUSH-CABLES FOR VIDEO PIPE INSPECTION SYSTEMS; U.S. Pat. No. 9,465,129, issued Oct. 11, 2016, entitled IMAGE-BASED MAPPING LOCATING SYSTEM; U.S. Pat. No. 9,468,954, issued Oct. 18, 2016, entitled PIPE INSPECTION SYSTEM WITH JETTER PUSH-CABLE; U.S. patent application Ser. No. 15/331,570, Oct. 21, 2016, entitled KEYED CURRENT SIGNAL UTILITY LOCATING SYSTEMS AND METHODS; U.S. patent application Ser. No. 15/345,421, Nov. 7, 2016, entitled OMNI-INDUCER TRANSMITTING DEVICES AND METHODS; U.S. Pat. No. 9,488,747, issued Nov. 8, 2016, entitled GRADIENT ANTENNA COILS AND ARRAYS FOR USE IN LOCATING SYSTEM; U.S. Pat. No. 9,494,706, issued Nov. 15, 2016, entitled OMNI-INDUCER TRANSMITTING DEVICES AND METHODS; U.S. patent application Ser. No. 15/360,979, Nov. 23, 2016, entitled UTILITY LOCATING SYSTEMS, DEVICES, AND METHODS USING RADIO BROADCAST SIGNALS; U.S. patent application Ser. No. 15/376,576, filed Dec. 12, 2016, entitled MAGNETIC SENSING BURIED OBJECT LOCATOR INCLUDING A CAMERA; U.S. Pat. No. 9,521,303, issued Dec. 13, 2016, entitled CABLE STORAGE DRUM WITH MOVEABLE CCU DOCKING APPARATUS; U.S. Pat. No. 9,523,788, issued Dec. 20, 2016, entitled MAGNETIC SENSING BURIED OBJECT LOCATOR INCLUDING A CAMERA; U.S. patent application Ser. No.

15/396,068, filed Dec. 30, 2016, entitled UTILITY LOCATOR TRANSMITTER APPARATUS AND METHODS; U.S. Pat. No. 9,571,326, issued Feb. 14, 2017, entitled METHOD AND APPARATUS FOR HIGH-SPEED DATA TRANSFER EMPLOYING SELF-SYNCHRONIZING QUADRATURE AMPLITUDE MODULATION (QAM); U.S. patent application Ser. No. 15/457,149, Mar. 13, 2017, entitled USER INTERFACES FOR UTILITY LOCATORS; U.S. patent application Ser. No. 15/457,222, Mar. 13, 2017, entitled SYSTEMS AND METHODS FOR LOCATING BURIED OR HIDDEN OBJECTS USING SHEET CURRENT FLOW MODELS; U.S. patent application Ser. No. 15/457,897, Mar. 13, 2017, entitled UTILITY LOCATORS WITH RETRACTABLE SUPPORT STRUCTURES AND APPLICATIONS U.S. patent application Ser. No. 15/470,713, Mar. 27, 2017, entitled UTILITY LOCATORS WITH PERSONAL COMMUNICATION DEVICE USER INTERFACES; U.S. patent application Ser. No. 15/485,082, Apr. 11, 2017, entitled MAGNETIC UTILITY LOCAOTR DEVICES AND METHODS; U.S. Pat. No. 9,625,602, issued Apr. 18, 2017, entitled SMART PERSONAL COMMUNICATION DEVICES AS USER INTERFACES; U.S. patent application Ser. No. 15/497,040, Apr. 25, 2017, entitled SYSTEMS AND METHODS FOR LOCATING AND/OR MAPPING BURIED UTILITIES USING VEHICLE-MOUNTED LOCATING DEVICES; U.S. Pat. No. 9,632,199, issued Apr. 25, 2017, entitled INDUCTIVE CLAMP DEVICES, SYSTEMS, AND METHODS; U.S. Pat. No. 9,632,202, issued Apr. 25, 2017, entitled ECONOMICAL MAGNETIC LOCATOR APPARATUS AND METHOD; U.S. Pat. No. 9,634,878, issued Apr. 25, 2017, entitled SYSTEMS AND METHODS FOR DATA SYNCHRONIZING QUADRATURE AMPLITUDE MODULATION (QAM); U.S. patent application Ser. No. 15/590,964, May 9, 2017, entitled BORING INSPECTION SYSTEMS AND METHODS; U.S. Pat. No. 9,651,711, issued May 16, 2017, entitled HORIZONTAL BORING INSPECTION DEVICE AND METHODS; U.S. patent application Ser. No. 15/623,174, Jun. 14, 2017, entitled TRACKABLE DIPOLE DEVICES, METHODS, AND SYSTEMS FOR USE WITH MARKING PAINT STICKS; U.S. patent application Ser. No. 15/626,399, Jun. 19, 2017, entitled SYSTEMS AND METHODS FOR UNIQUELY IDENTIFYING BURIED UTILITIES IN A MULTI-UTILITY ENVIRONMENT; U.S. Pat. No. 9,684,090, issued Jun. 20, 2017, entitled NULLED-SIGNAL LOCATING DEVICES, SYSTEMS, AND METHODS; U.S. Pat. No. 9,696,447, issued Jul. 4, 2017, entitled BURIED OBJECT METHODS AND APPARATUS USING MULTIPLE ELECTROMAGNETIC SIGNALS; U.S. Pat. No. 9,696,448, issued Jul. 4, 2017, entitled GROUND-TRACKING DEVICES FOR USE WITH A MAPPING LOCATOR; U.S. patent application Ser. No. 15/670,845, Aug. 7, 2017, entitled HIGH FREQUENCY AC-POWERED DRAIN CLEANING AND INSPECTION APPARATUS AND METHODS; U.S. patent application Ser. No. 15/681,250, Aug. 18, 2017, entitled ELECTRONIC MARKER DEVICES AND SYSTEMS; U.S. patent application Ser. No. 15/681,409, filed Aug. 20, 2017, entitled WIRELESS BURIED PIPE AND CABLE LOCATING SYSTEMS; U.S. Pat. No. 9,746,572, issued Aug. 29, 2017, entitled ELECTRONIC MARKER DEVICES AND SYSTEMS; U.S. Pat. No. 9,746,573, issued Aug. 29, 2017, entitled WIRELESS BURIED PIPE AND CABLE LOCATING SYSTEMS; U.S. Pat. No. 9,769,366, issued Sep. 19, 2017, entitled SELF-GROUNDING TRANSMITTING PORTABLE CAMERA CONTROLLER FOR USE WITH PIPE INSPECTION SYSTEMS; U.S. patent application Ser. No. 15/728,250, Oct. 9, 2017, entitled OPTICAL GROUND TRACKING APPARATUS, SYSTEMS, AND METHODS FOR USE WITH BURIED UTILITY LOCATORS; U.S. Pat. No. 9,784,837, issued Oct. 10, 2017, entitled OPTICAL GROUND TRACKING APPARATUS, SYSTEMS, AND METHODS; U.S. patent application Ser. No. 15/805,007, filed Nov. 6, 2017, entitled PIPE INSPECTION SYSTEM CAMERA HEADS; U.S. patent application Ser. No. 15/806,219, Nov. 7, 2017, entitled MULTI-CAMERA PIPE INSPECTION APPARATUS, SYSTEMS AND METHODS; U.S. Provisional Patent Application 62/580,386, Nov. 1, 2017, entitled THREE AXIS MEASUREMENT MODULES AND SENSING METHODS; U.S. Pat. No. 9,824,433, issued Nov. 21, 2017, entitled PIPE INSPECTION SYSTEM CAMERA HEADS; U.S. Pat. No. 9,835,564, issued Dec. 5, 2017, entitled MULTI-CAMERA PIPE INSPECTION APPARATUS, SYSTEMS, AND METHODS; U.S. Pat. No. 9,841,503, issued Dec. 12, 2017, entitled OPTICAL GROUND TRACKING APPARATUS, SYSTEMS, AND METHODS; U.S. patent application Ser. No. 15/846,102, Dec. 18, 2017, entitled SYSTEMS AND METHODS FOR ELECTRONICALLY MARKING, LOCATING, AND VIRTUALLY DISPLAYING BURIED UTILITIES; U.S. patent application Ser. No. 15/866,360, Jan. 9, 2018, entitled TRACKED DISTANCE MEASURING DEVICE, SYSTEMS, AND METHODS; U.S. patent application Ser. No. 15/870,787, Jan. 12, 2018, entitled MAGNETIC FIELD CANCELING AUDIO SPEAKERS FOR USE WITH BURIED UTILITY LOCATORS OR OTHER DEVICES; U.S. Provisional Patent Application 62/620,959, Jan. 23, 2018, entitled RECHARGEABLE BATTERY PACK ONBOARD CHARGE STATE INDICATION METHODS AND APPARATUS; U.S. Pat. No. 9,880,309, issued Jan. 30, 2018, entitled UTILITY LOCATOR TRANSMITTER APPARATUS AND METHODS; U.S. patent application Ser. No. 15/889,067, Feb. 5, 2018, entitled UTILITY LOCATOR TRANSMITTER DEVICES, SYSTEMS, AND METHODS WITH DOCKABLE APPARATUS; U.S. Pat. No. 9,891,337, issued Feb. 13, 2018, entitled UTILITY LOCATOR TRANSMITTER DEVICES, SYSTEMS, AND METHODS WITH DOCKABLE APPARATUS; U.S. patent application Ser. No. 15/919,077, Mar. 12, 2018, entitled PORTABLE PIPE INSPECTION SYSTEMS AND METHODS; U.S. patent application Ser. No. 15/922,703, Mar. 15, 2018, entitled SELF-LEVELING INSPECTION SYSTEMS AND METHODS; U.S. patent application Ser. No. 15/925,643, Mar. 19, 2018, entitled PHASE-SYNCHRONIZED BURIED OBJECT TRANSMITTER AND LOCATOR METHODS AND APPARATUS; U.S. patent application Ser. No. 15/925,671, Mar. 19, 2018, entitled MULTI-FREQUENCY LOCATING SYSTEMS AND METHODS; U.S. Pat. No. 9,924,139, issued Mar. 20, 2018, entitled PORTABLE PIPE INSPECTION SYSTEMS AND APPARATUS; U.S. patent application Ser. No. 15/936,250, Mar. 26, 2018, entitled GROUND TRACKING APPARATUS, SYSTEMS, AND METHODS; U.S. Pat. No. 9,927,368, issued Mar. 27, 2018, entitled SELF-LEVELING INSPECTION SYSTEMS AND METHODS; U.S. Pat. No. 9,927,545, issued Mar. 27, 2018, entitled MULTI-FREQUENCY LOCATING SYSTEM AND METHODS; U.S. Pat. No. 9,928,613, issued Mar. 27, 2018, entitled GROUND TRACKING APPARATUS, SYSTEMS, AND METHODS; U.S. Provisional Patent Application 62/656,259, Apr. 11, 2018, entitled GEOGRAPHIC MAP UPDATING METHODS AND SYSTEMS; U.S. Pat. No. 9,945,976, issued Apr. 17, 2018, entitled UTILITY LOCA- TOR APPARATUS, SYSTEMS, AND METHODS; U.S. patent application Ser. No. 15/960,340, Apr. 23, 2018, entitled METHODS AND SYSTEMS FOR GENERATING INTERACTIVE MAPPING DISPLAYS IN CONJUNCTION WITH USER INTERFACE DEVICES; U.S. Provisional Patent Application 62/688,259, filed Jun. 21, 2018, entitled ACTIVE MARKER DEVICES FOR UNDERGROUND USE; United States Provisional Patent Application 62/726,500, filed Sep. 4, 2018, entitled VIDEO PIPE INSPECTION SYSTEMS, DEVICES, AND METHODS INTEGRATED WITH NON-VIDEO DATA RECORDING AND COMMUNICATION FUNCTIONALITY; and U.S. patent application Ser. No. 16/144,878, filed Sep. 27, 2018, entitled MULTIFUNCTION BURIED UTILITY LOCATING CLIPS. The content of each of the above-described patents and applications is incorporated by reference herein in its entirety. The above applications may be collectively denoted herein as the "co-assigned applications" or "incorporated applications."

Various embodiments of multi-axis measurement modules in accordance with aspects of the present disclosure may include a mounting element that retains an array of single-axis sensors. The single-axis sensors may be of the same make and model eliminating variances in resolution and temperature sensitivity to the extent possible. Each sensor may be retained in an orientation angled away from a common mounting plane such that each sensor may measure along one axis orthogonal to the measurement axes of the other sensors wherein each measurement axis further intersects the other two axes at a common intersection point.

In one aspect, sensor module measurements may be processed in hardware and/or software/firmware to compensate for soft and hard iron distortions.

In another aspect, sensor module measurements may be processed in hardware and/or software/firmware to compensate for temperature variances. In some such embodiments, the measurement modules may include one or more temperature sensors.

Sensors of multi-axis measurement modules in accordance with aspects of the present disclosure may be one or more of compass sensors, gyroscopic sensors, accelerometers, and/or other sensor devices.

In another aspect, one or more multi-axis measurement modules may be incorporated in a magnetically sensed buried utility locator device.

In another aspect, the present disclosure relates to a dual three-axis measurement module embodiment comprising two three-axis measurement modules positioned on opposite sides of a PCB along a common axis passing centrally through each three-axis measurement module and the PCB. Embodiments may include one or more temperature sensors. In some embodiments, the three-axis measurement modules may align on opposite sides of the PCB. In other embodiments, the three-axis measurement modules may be positioned so as to not align on opposite sides of the PCB. In one exemplary embodiment, one three-axis measurement module embodiment may be positioned so as to be rotated sixty degrees out of alignment to that of another three-axis measurement module.

Various additional aspects, features, and functions are described below in conjunction with FIGS. 1A through 9 of the appended Drawings.

It is noted that as used herein, the term, "exemplary" means "serving as an example, instance, or illustration." Any aspect, detail, function, implementation, and/or embodiment described herein as "exemplary" is not necessarily to be construed as preferred or advantageous over other aspects and/or embodiments.

Example Sensor Module Embodiments

Turning to FIGS. 1A-1E, an example embodiment of a three-axis measurement module 100 in accordance with certain aspects of the present invention is shown. Module 100 may include a mounting element, such as mounting element 110 onto which three single-axis sensors 130 are mounted. The single axis sensors may sense along a reference axis of the sensing device/IC, such as normal to the upward-facing side of an IC chip in an exemplary embodiment, or in other orientations as defined by the particular IC or other sensing device. Some sensors may have more than one sensing axis (e.g., X, Y, or X, Y, Z axes relative to a IC layout or other reference), in which case the corresponding mounting element may be shaped accordingly.

The three sensors 130 are preferably of the same make and model of sensor so that variances in resolution and temperature sensitivity are minimized. Individual sensors may be pre-measured and tested to further reduce device to device variation to within a desired tolerance before placing them on the mounting element. Other sensor combinations may be used, particularly if relevant sensor device performance parameters are matched to a similar degree as in implementations using the same make and model of sensor. Combinations of modules such as module 100 or similar or equivalent modules may be used in arrays or pairs, such as in the dual measurement module embodiment described subsequently herein with respect to FIGS. 6 and 7.

Figure 9:
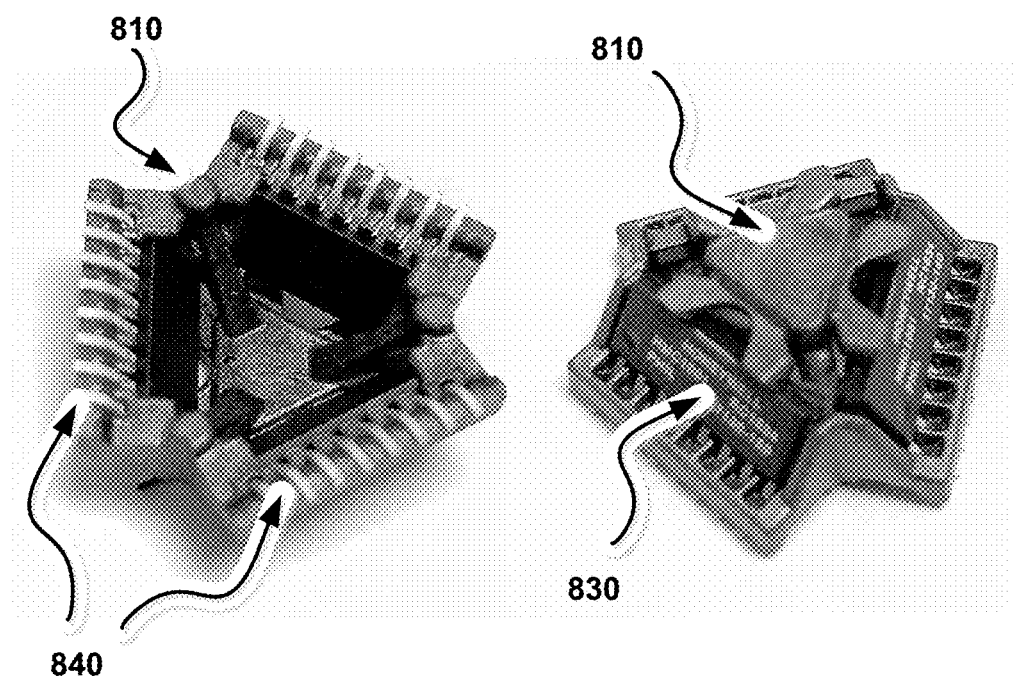
FIG. 9 is an image of an embodiment of a three axis measurement module mounting element with attached magnetic sensor integrated circuits (ICs).

In an exemplary embodiment for magnetic sensing, the single-axis sensors 130 may be HMC 1001 single axis compass sensors (i.e., integrated circuit devices for low field magnetic sensing using anisotropic magnetoresistance technology), which are currently commercially available from Honeywell. An example of these sensor chips used in in implementation is shown in FIG. 9, with the ICs denoted as element 830.

In other sensor embodiments, the single-axis sensors may be other compass sensors (for magnetic field sensing) or other types of single-axis sensors for sensing other parameters (e.g., accelerometers, tilt sensors, magnetometers, and the like).

In an exemplary embodiment, the single-axis sensors 130 may be oriented in a triangular pattern, for example in three separate sensor retaining elements on or coupled to the mounting element, such as retainers 112 shown on mounting element 110. The sensor retainers 112 may be shaped and sized to position the single-axis sensors 130 in a largely equilateral triangle pattern. The mounting element may be disposed on a printed circuit board (PCB), such as planar PCB 150 shown in FIG. 1D.

Figure 1B:
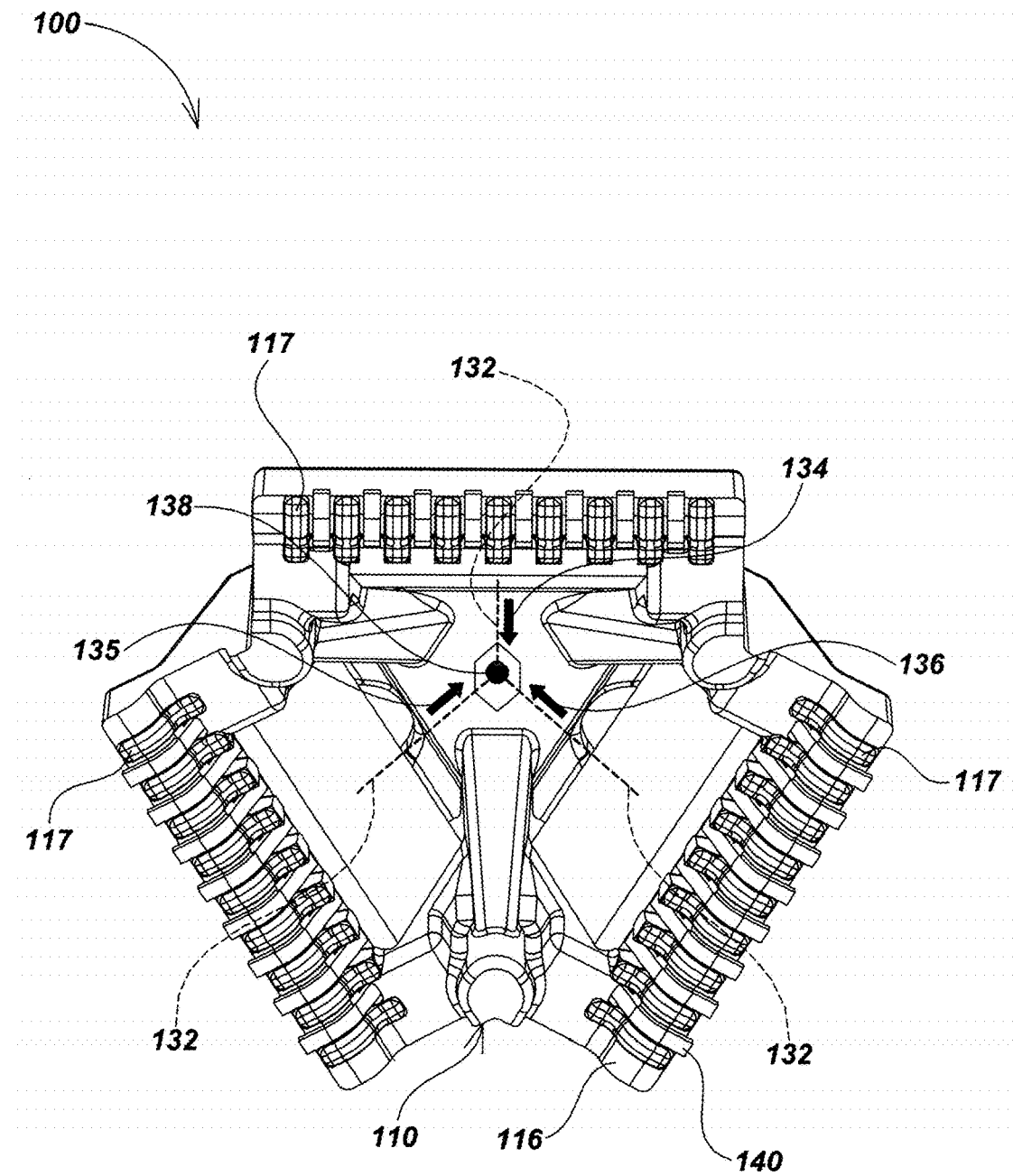
FIG. 1B is a bottom up isometric view of the three-axis measurement module embodiment of FIG. 1A.
Figure 1C:
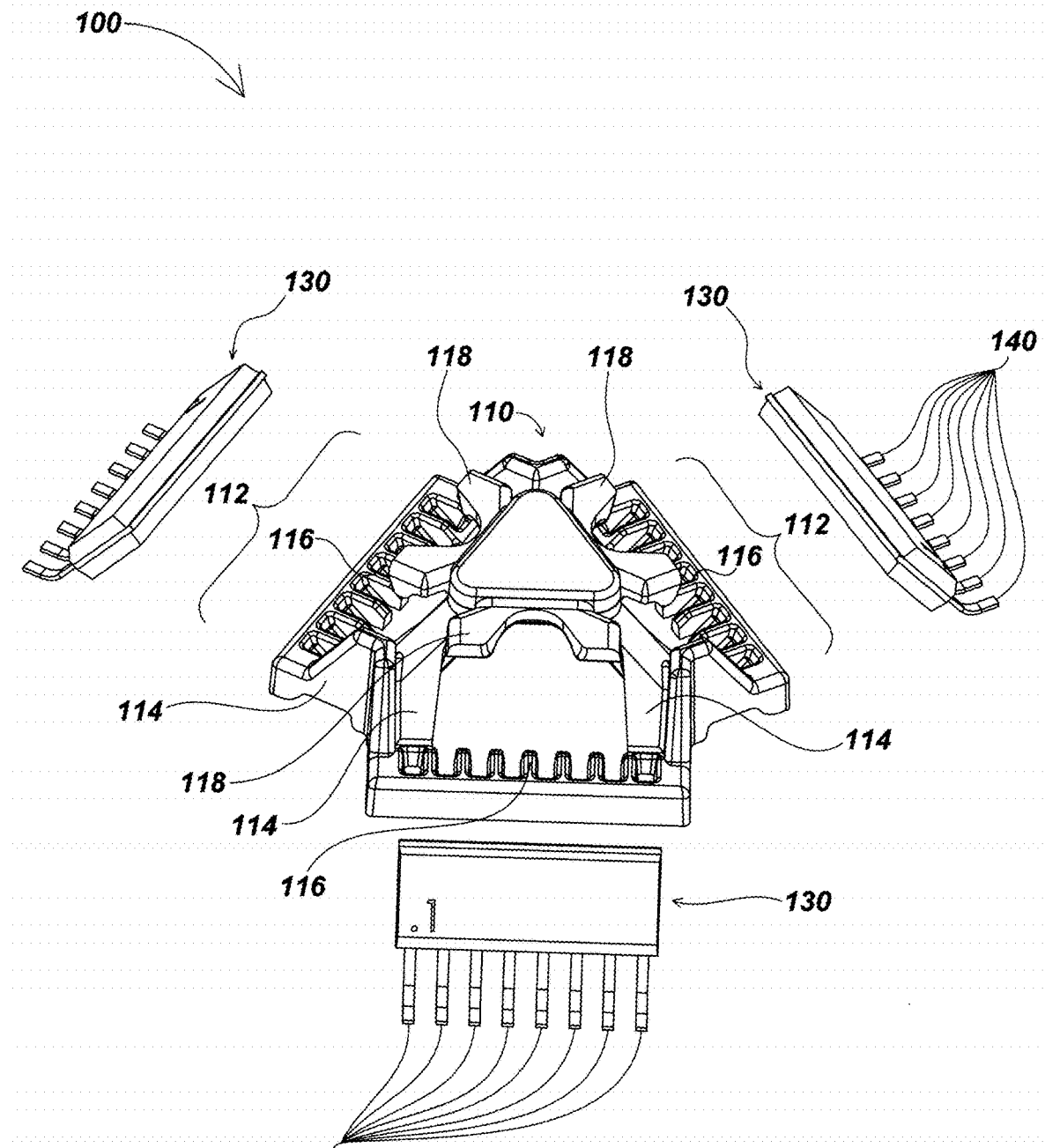
FIG. 1C is an exploded view of the three-axis measurement module embodiment of FIG. 1A.
Figure 1D:
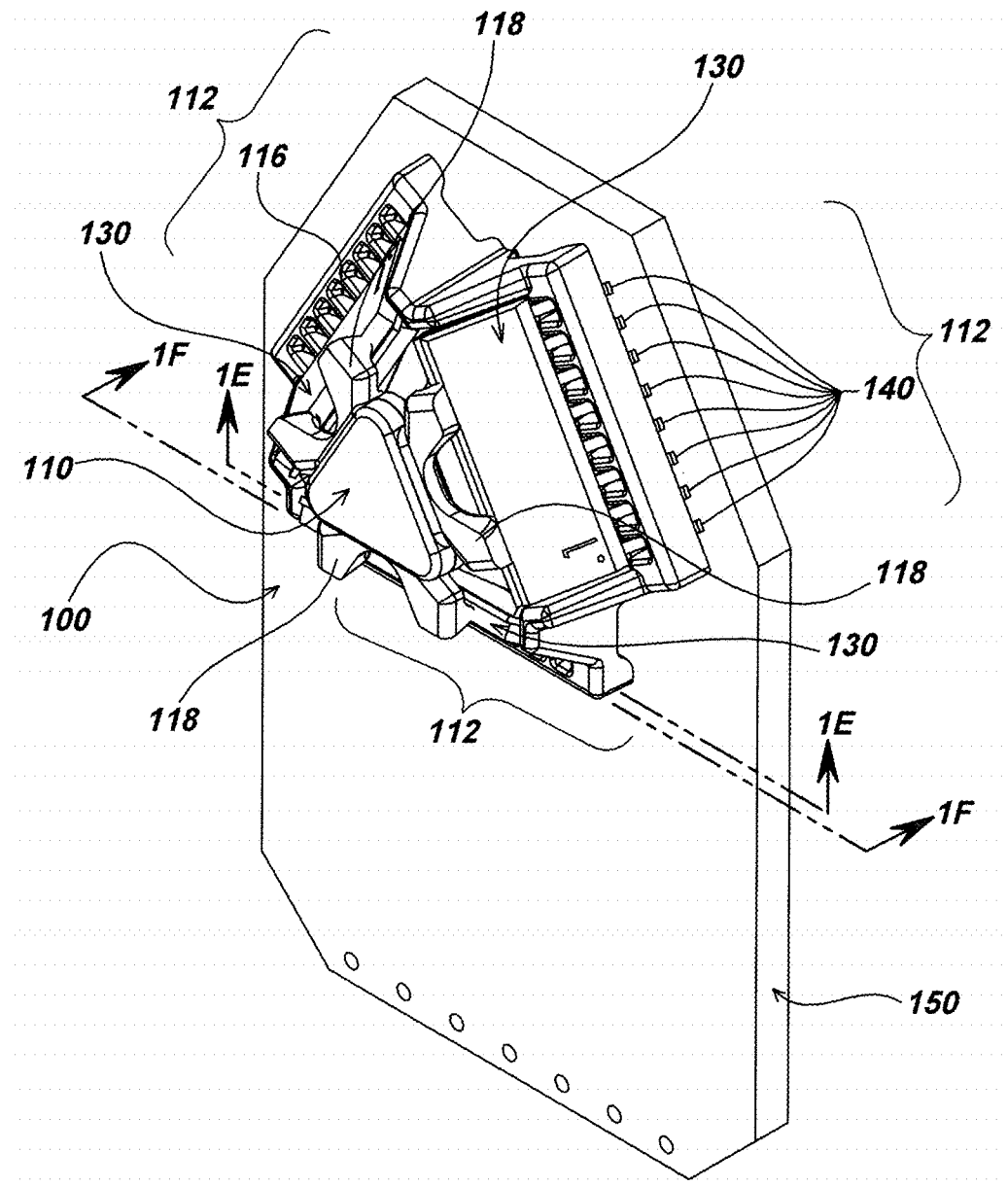
FIG. 1D is an isometric view of three-axis measurement module embodiment of FIG. 1A on a PCB.
Figure 1E:
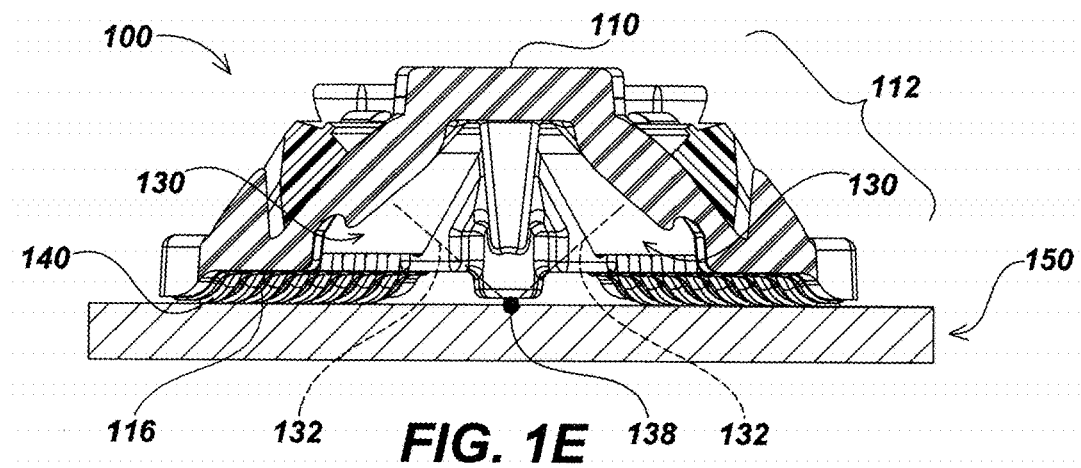
FIG. 1E is a section view of the three-axis measurement module and PCB embodiment from FIG. 1D along line 1E-1E.
Figure 1F:
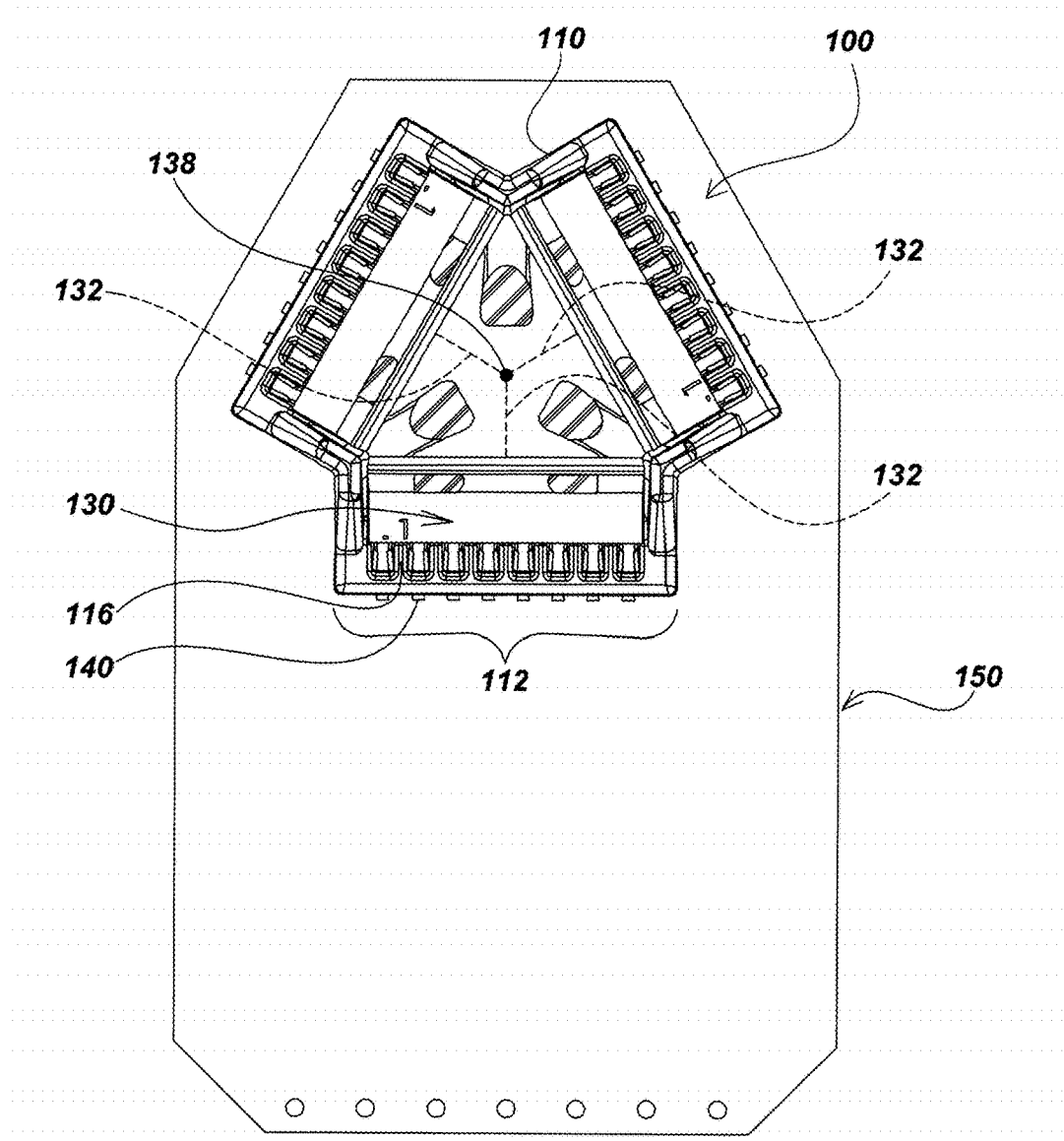
FIG. 1F is a section view of the three-axis measurement module and PCB embodiment from FIG. 1D along line 1F-1F.
Figure 1G:
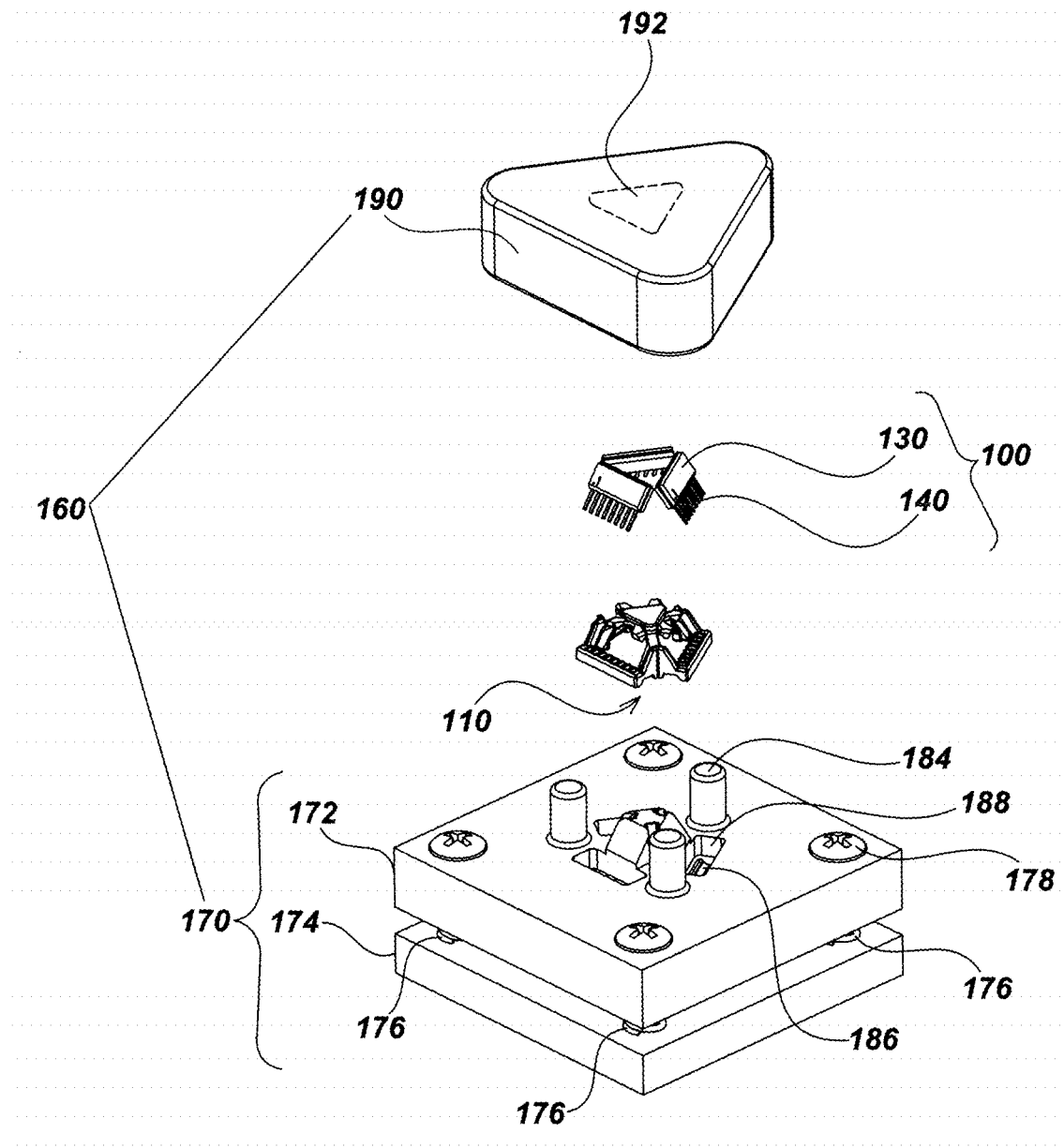
FIG. 1G is an illustration of the three-axis measurement module embodiment of FIG. 1A and a sensor lead bending fixture.

Each single-axis sensor 130 may preferably be positioned close to neighboring single-axis sensors 130 so as to sense along axes that are closest to the same point in space as practical within a given sensor case, housing, mounting element, or other topological configuration (e.g., measurement axes 132 of FIGS. 1B, 1E, and 1F and intersection point 138 of FIGS. 1B, 1E, and 1F). For example, the sensors may be positioned in close proximity in one or more dimensions so as to minimize the aggregate distances between the common sensor measurement point or centroid.

Each sensor retainer 112 may have angled platforms 114 (such as those shown in FIG. 1C) that may support a corresponding single-axis sensor 130 in each sensor retainer 112. When a single-axis sensor 130 is mounted within the sensor retainer 112, the sensor retainer 112 may orient the single-axis sensor 130 to take measurements along a measurement axis 132 (as is shown in FIGS. 1B, 1E, and 1F) in measurement directions 134, 135, and 136. The measurement axis 132 of each individual single-axis sensor 130 may be angled in measurement directions 134, 135, and 136 towards a common intersection point 138.

Still referring to FIGS. 1A-1E, sensor leads 140 on each single-axis sensor 130 may pass between tines of a comb-shaped feature 116 formed along the bottom of each sensor retainer 112 on mounting element 110. In assembly, sensor leads 140 may electrically connect to traces on a PCB such as PCB 150, allowing the three-axis measurement module 100 to receive power and send and/or receive data signals as described subsequently herein. An example of such sensor leads are shown in the embodiment of FIG. 9, with the leads denoted as leads 840 on IC element 830, with three ICs 830 mounted in mounting element embodiment 810 as shown in FIG. 9.

The sensor leads may be electrically coupled to a signal conductor or conductors to provide signals to or from the sensors to corresponding signal terminals of the module. The signal terminals may be used to couple the module signal and power connections to an external or associated device, such as, for example, a buried utility locator and its associated electronics.

Each single-axis sensor 130 may snap into and be held in place along platforms 114 (as shown in FIG. 1C) on each sensor retainer 112 via nubbins 118 (as shown in FIGS. 1A-1D). An implementation of a module with sensors 830 mounted in place with such nubbins is shown in the image of FIG. 9. It is noted that in the three-axis measurement module embodiment 100 illustrated in FIGS. 1A-1E, there are two nubbins 118 retaining each single-axis sensor 130 to distribute retaining force applied at each single-axis sensor 130 without bending or otherwise causing physical deformations of the single-axis sensor 130. However, other mechanical attachment mechanisms may also be used in various embodiments. Platforms 114 (as shown in FIG. 1C) and nubbins 118 may be shaped and sized to ensure that each single-axis sensor 130 is precisely positioned allowing precision measurement axis 132 orientation relative to the measurement axes 132 of the other single-axis sensors 130.

Turning to FIGS. 1D-1F, the three-axis measurement module 100 may be secured to the PCB 150 via soldering of sensor leads 140 on the single-axis sensors 130 to corresponding circuit traces on PCB 150, or to other conductors, such as wires and the like. In some embodiments, optical connections may be used in addition to or in place of electrical conductive connections and terminals, with the optical connections replacing electrical circuit traces, wires, and electrical connections. Example IC sensor leads as solder pins on a physical implementation are shown in FIG. 9 as pins 840.

In other embodiments, other securing mechanisms may be used including, but not limited to, adhesives, bolting or screwing the three-axis measurement module to the PCB, heat staking, and the like. For instance, in some embodiments, additional nubbins may be formed along the bottom the three-axis measurement module. The nubbins may fit through holes on the PCB for thermoplastic staking in assembly.

The position and orientation of three single-axis sensors 130 provided by the mounting element 110 allows for measurements to be generated along an axis of each individual single-axis sensor 130 nearest to a common point or centroid (e.g., intersection point 138 of FIGS. 1B, 1E, and 1F) between all single-axis sensors 130, thereby compensating for small variances in sensor positioning inherent in planar PCB layouts. Likewise, temperature variation problems of planar sensor layouts may be mitigated using a three-axis measurement module, such as the three-axis measurement module 100.

Figure 8:
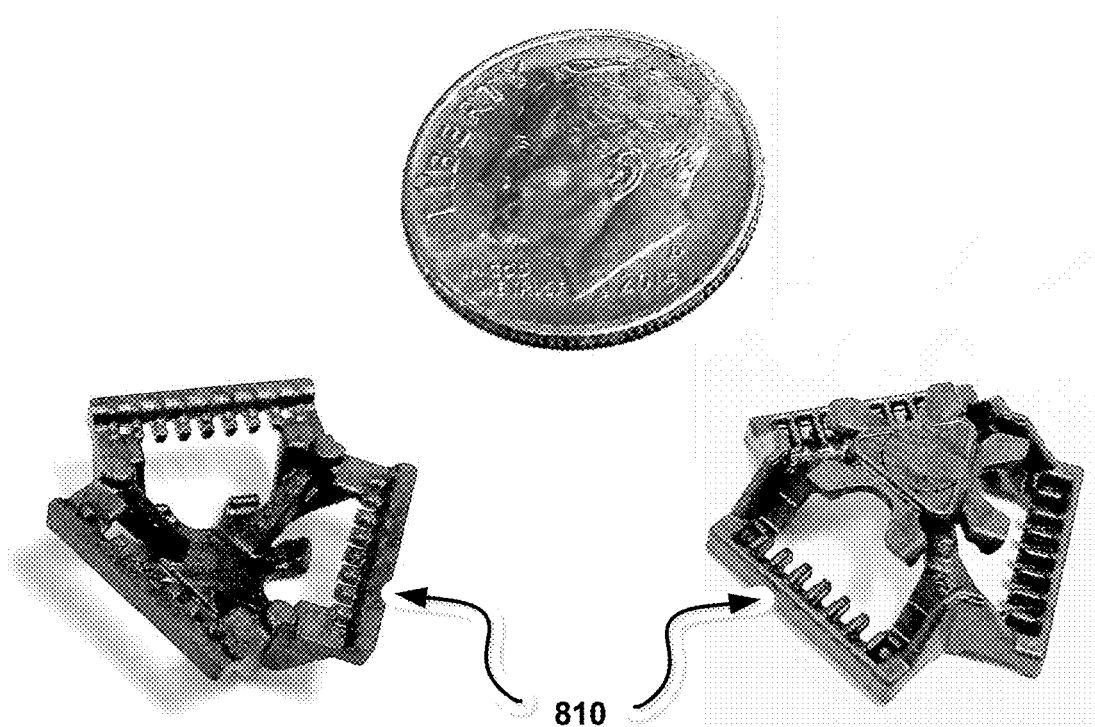
FIG. 8 is an image of an embodiment of a three axis measurement module mounting element.

FIGS. 8 and 9 are images of a physical implementation of a plastic or polymer mounting element 810 corresponding with mounting element embodiment 110, and associated magnetic sensors 830, corresponding with sensors 130, showing additional details including sizing (relative to a U.S. dime coin), positioning of the sensors in the mounting element, and electrical conductive pins 840 positioned on the back side of the mounting element 810. In an exemplary embodiment the mounting element comprising a plastic or polymer material, however, in some embodiments other materials such as ceramics, metals, or other materials may be used depending on the requirements of a particular application (e.g., based on physical parameter requirements such as strength, thermal conductivity, magnetic properties, shielding properties, electrical conductivity, melting point, and the like). Different colored materials may be also be used depending on the specific application requirements.

Figure 2A:
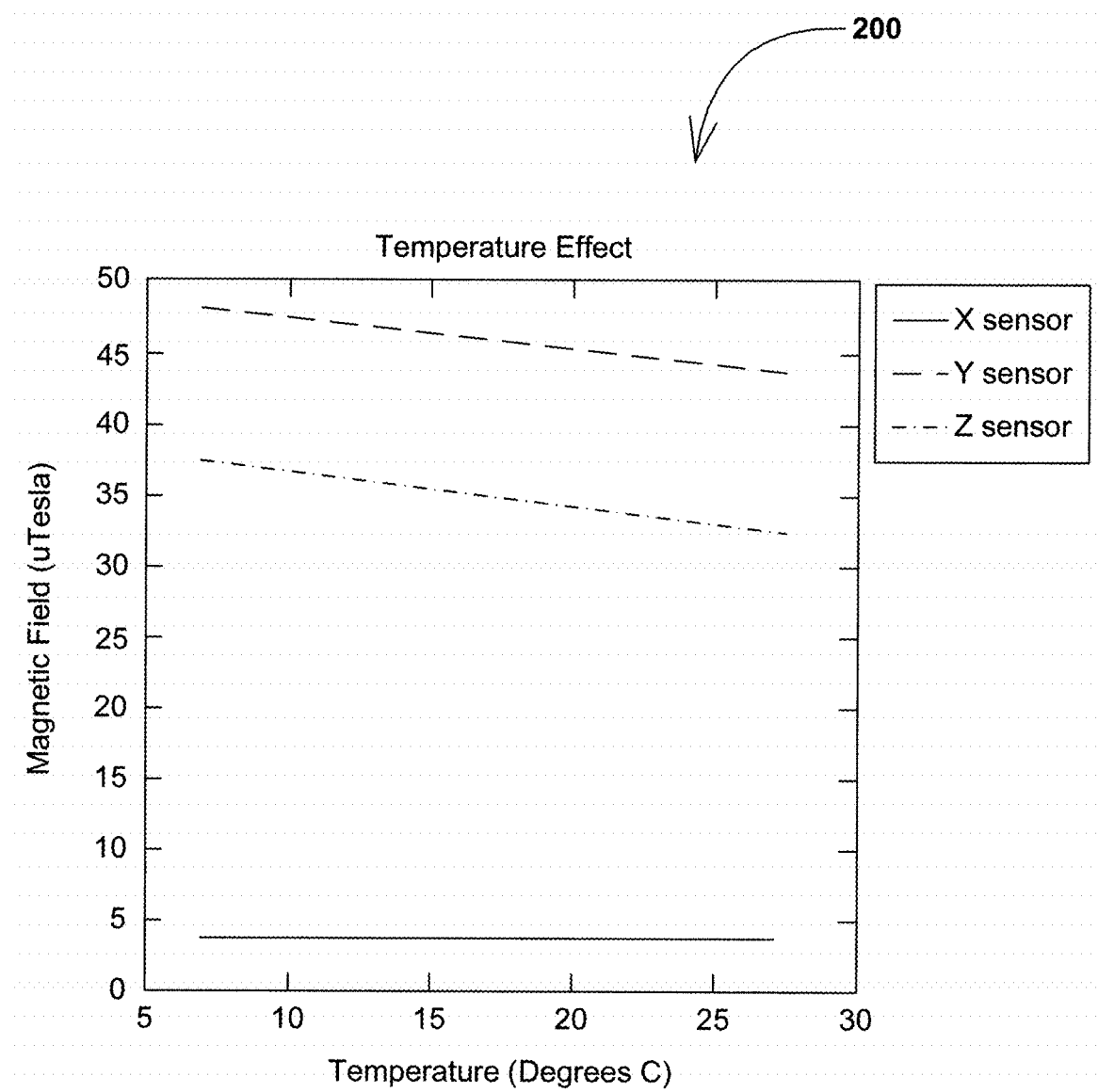
FIG. 2A is a chart showing proportional temperature change between single-axis sensors in a three-axis measurement module.
Figure 2B:
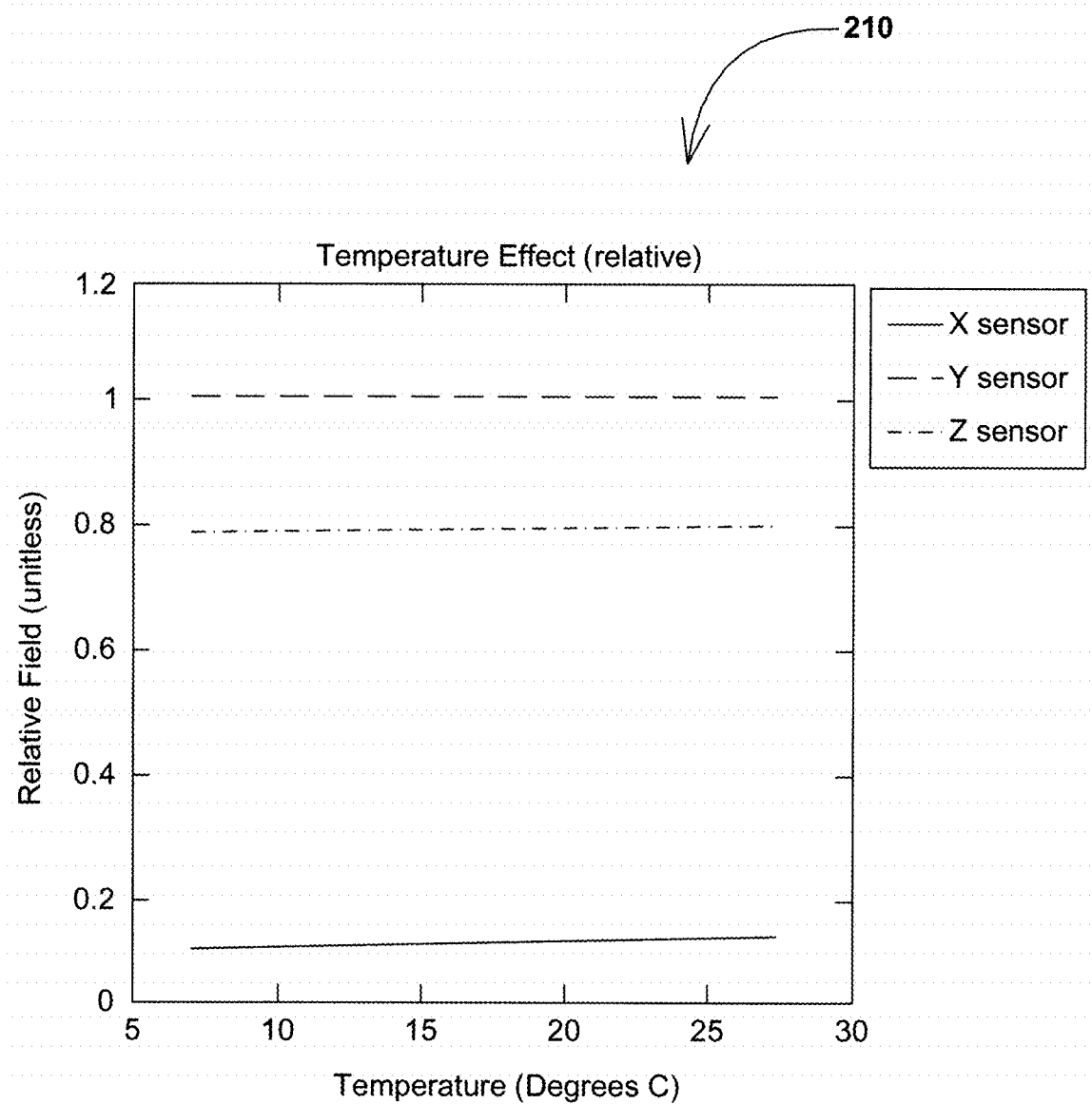
FIG. 2B is a chart showing normalized proportional temperature change between single-axis sensors in a three-axis measurement module.

Turning to FIGS. 2A and 2B, example data showing the effect of temperature variances to measured magnetic fields at each sensor for a three-axis magnetic measurement module embodiment are illustrated. Graph 200 of FIG. 2A illustrates proportional temperature to magnetic field measurement differences between each sensor. The proportional temperature differences may be normalized by processing sensor output signals in accordance with data such as the example data shown in graph 210 of FIG. 2B in one or more signal processing elements/modules. Such proportional temperature to sensor measurement adjustments/corrections may be used to refine sensor measurements, and the temperature variation may be compensated at each sensor. It is noted that the single-axis sensors of the three-axis measurement module embodiment for FIGS. 2A and 2B may be compass or like magnetic field sensors. In other embodiments, proportional measurement results may occur with three-axis measurement module embodiments having other types of single axis sensors, such as accelerometers, tilt sensors, or other sensor types as described herein or known or developed in the art.

In an exemplary embodiment, one or more temperature sensors may be included in the sensor module to measure temperature, with the measured data then used to compensate for temperature variances to improve sensor output signals/data. This compensation may be done in some embodiments in an onboard processing element or elements (not shown) such as an ASIC, programmable device, and the like on the sensor module itself, or may be implemented on other separate components with corresponding processing elements, such as on a utility locator other device on which the sensor module(s) are disposed.

Figure 2C:
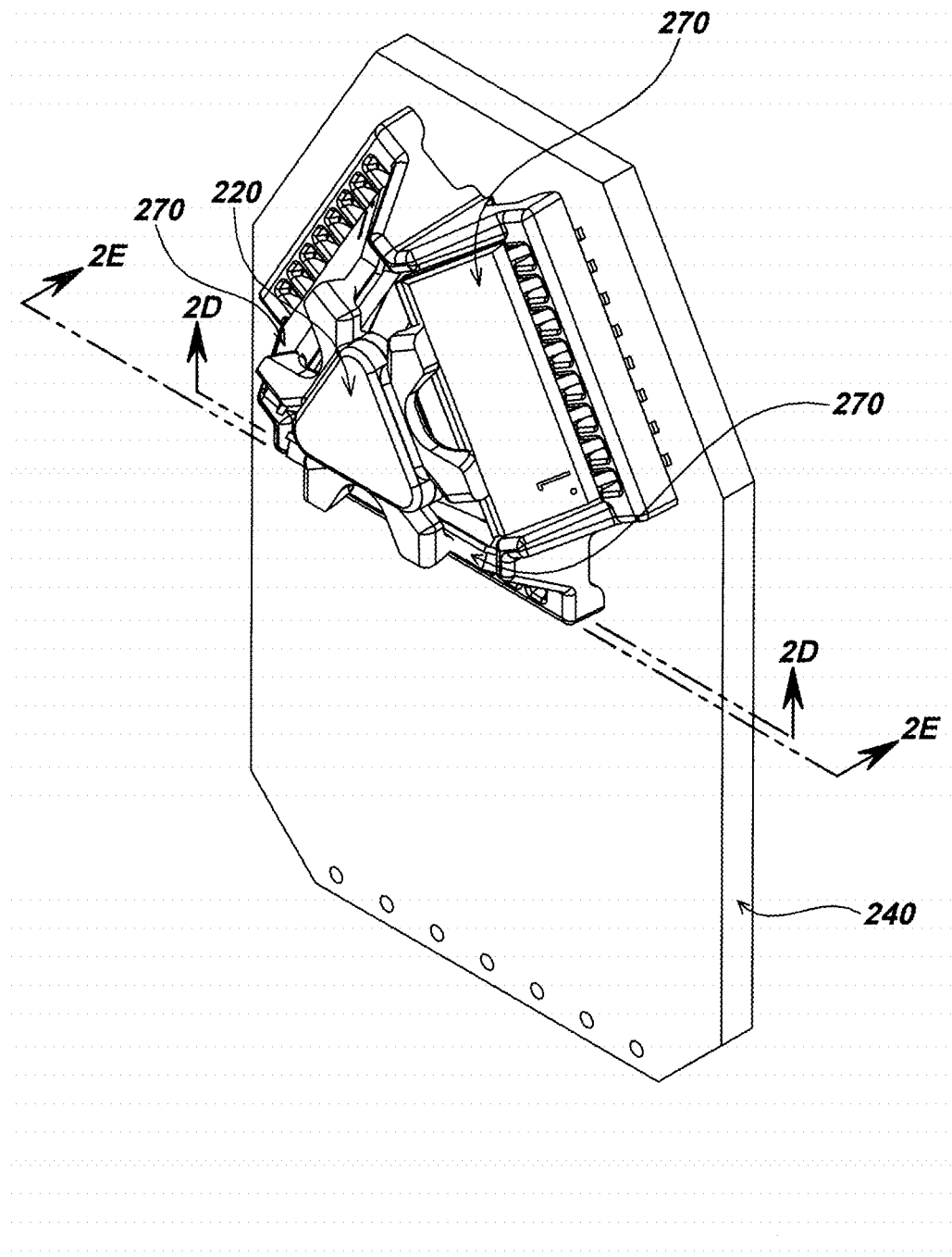
FIG. 2C is a three-axis measurement module embodiment with a temperature sensor on a PCB.
Figure 2D:
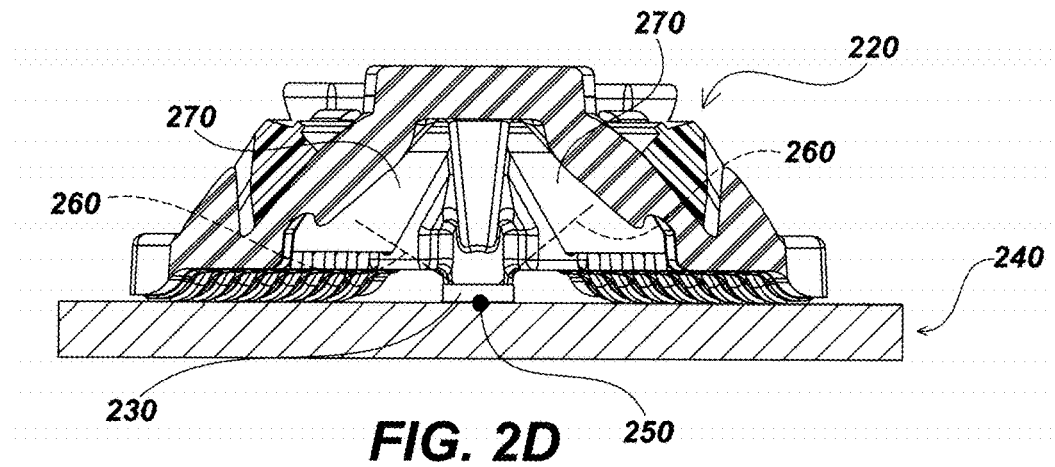
FIG. 2D is a section view of the three-axis measurement module and PCB embodiment of FIG. 2C along line 2D-2D.
Figure 2E:
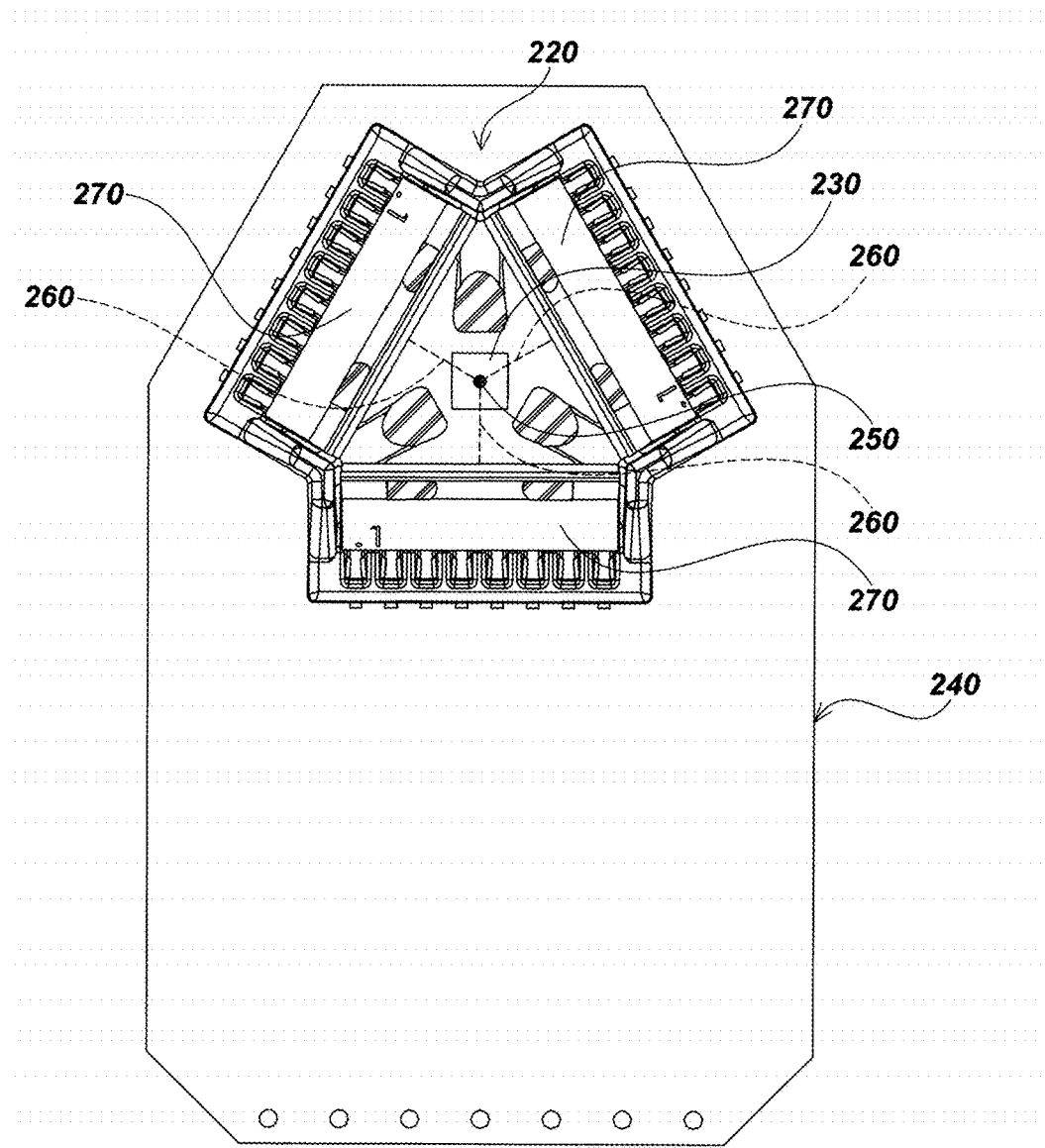
FIG. 2E is a section view of the three-axis measurement module and PCB embodiment of FIG. 2C along line 2E-2E.

An example is shown in FIGS. 2C-2E. These figures illustrate a three-axis measurement module embodiment 220 including temperature sensor 230s (FIGS. 2D and 2E) on a printed circuit board (PCB). The three-axis measurement module 220 may be the same as or similar to or share aspects with the three-axis measurement module 100 of FIG. 1A-1G, or other sensor modules disclosed herein, with the addition of temperature sensor 230 (FIGS. 2D and 2E) on a PCB 240. Further illustrated in FIGS. 2D and 2E, the temperature sensor 230 may be positioned on PCB 240 at or near the point of intersection 250 of measurement axes 260 from each sensor 270.

Other variances or distortions in individual sensor output signals may be compensated/adjusted for in order to generate refined measurements in various three-axis measurement module embodiments. This compensation/adjustment may be done in some embodiments in an onboard processing element or elements (not shown) such as an ASIC, programmable device, and the like on the sensor module itself, or may be implemented on other separate components with corresponding processing elements, such as on a utility locator other device on which the sensor module(s) are disposed.

Such distortion compensations may include compensation/adjustment for soft and hard iron distortions in three-axis magnetic sensor module embodiments. For instance, along each of the measurement axes, such as the various measurement axes 132 of FIGS. 1B, 1E, and 1F, the sensor may generate Mx, My, and Mz measurements along the horizontal and vertical axes. A transformation/rotational matrix (notated herein with r1-r9 values) may be applied to the Mx, My, and Mz measurements to compensate for soft iron distortions. Likewise, hard iron distortions, Bx, By, Bz, may be compensated for by first subtracting the Bx, By, and Bz values from the Mx, My, and Mz measurements providing the following:

$$\begin{bmatrix} x \\ y \\ z \end{bmatrix} = \begin{bmatrix} r1 & r2 & r3 \\ r4 & r5 & r6 \\ r7 & r8 & r9 \end{bmatrix} * \left( \begin{bmatrix} Mx \\ My \\ Mz \end{bmatrix} - \begin{bmatrix} Bx \\ By \\ Bz \end{bmatrix} \right)$$

The resulting x, y, and z values are calibrated values in the horizontal and vertical planes compensating for soft and hard iron distortions.

Referring back to FIG. 1G, in assembly the three-axis measurement module 100 may be fit into a sensor lead bending fixture embodiment 160 to physically bend sensor leads 140 and orient the sensor leads 140 into proper position for soldering onto traces on a PCB, such as PCB 150 of FIG. 1D. Such a lead bending fixture may be used in fabricating three-axis measurement module embodiments with proper lead orientation and position, thus providing high resolution three-axis measurement data with simplified ease in manufacture.

The sensor lead bending fixture 160 may have a bottom fixture half 170 and top fixture half 190. The bottom fixture half 170 may include a top platform 172 and bottom platform 174 held apart by a series of springs 176 (partially obscured within FIG. 1G). The springs 176 may each be retained by a bolt 178 which may further hold together the top platform 172 and bottom platform 174. When a downward force is applied to the top platform 172, the springs 176 may compress, and the top platform 172 may slide relative to bolts 178 allowing the top platform 172 to physically move downward.

In assembly, the three-axis measurement module 100 may seat onto and be supported by a module support feature 182. A series of post features 184 may extend upward from the top surface of top platform 172 near where each of the three corners of the three-axis measurement module 100 may seat upon use. The post features 184 may guide the top fixture half 190 as it is pressed into the bottom fixture half 170 to properly bend sensor leads 140. It is noted that the top fixture half 190 is formed with a cavity 192 (notated by a dotted line in FIG. 1G) dimensioned to snugly fit about the three-axis measurement module 100 and post features 184. In assembly, each single-axis sensor 130 may be snapped into place within the mounting element 110 by downward force exerted onto the top fixture half 190. Further exertion of a downward force onto the top fixture half 190 may cause the sensor leads 140 to be bent by pressing them into ramped features 186 formed on the bottom platform 174 that are dimensioned to fit into holes 188 on the top platform 172. The ramped features 186 are shaped to physically bend the sensor leads 140 to seat between contoured ridge features 117 (FIGS. 1B, 1E, and 1F) formed along the bottom of each sensor retainer 112 (FIGS. 1B, 1E, and 1F) and further allow proper connection to traces on a PCB such as PCB 150 of FIG. 1D in assembly.

Figure 3:
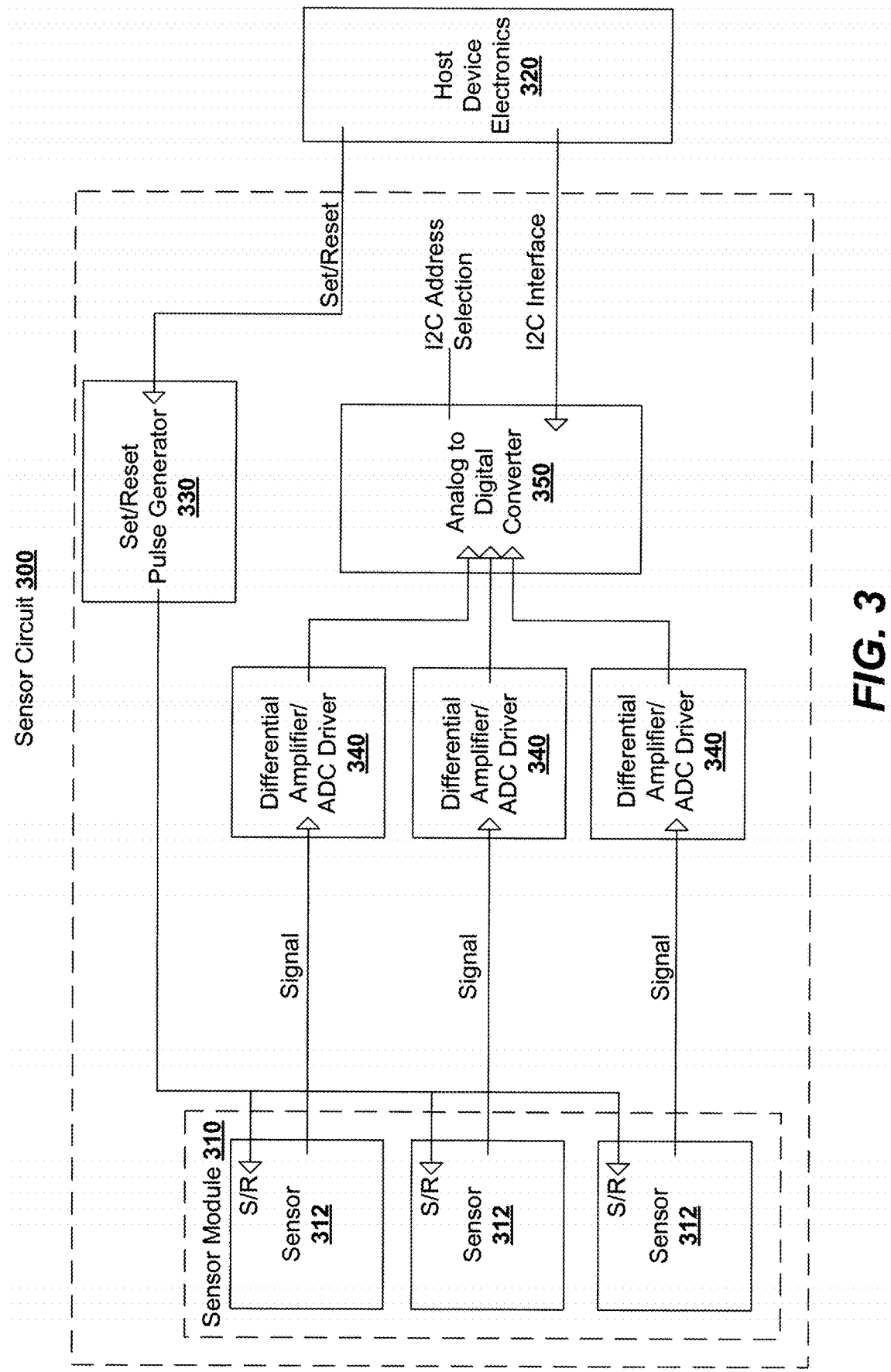
FIG. 3 is an exemplary diagram of a circuit embodiment for use with a three-axis measurement module.

Turning to FIG. 3, an exemplary circuit diagram of a sensor circuit embodiment 300 is illustrated. The sensor circuit 300 may have a sensor module 310 of multiple single axis sensors 312. The sensor circuit 300 may be included on a PCB such as PCB 150 of FIG. 1D. The sensor module 310 may be the same as or similar to the three-axis sensor module 100 of FIGS. 1A-1G. The sensors 312 may be as described with respect to the single-axis sensors 130 of FIGS. 1A-1G.

The sensor circuit 300 may be in a module or within or otherwise operatively connected to host device electronics 320. These may be of a device using one or more three-axis sensor modules, such as a utility locator, inspection camera system, or other device or system. The host device may provide processing, electrical power, and storage of data to sensor circuit 300, such as in electronics and processing element(s) therein. Sensor circuit 300 may include a set/reset pulse generator 330 providing set/reset signals to each sensor 312. Signals generated by sensors 312 may be communicated to differential amplifier/analog to digital converter drivers 340 within sensor circuit 300 and further to an analog to digital converter 350. An I2C interface may further be established between the host device electronics 320 and analog to digital converter 350.

Figure 4:
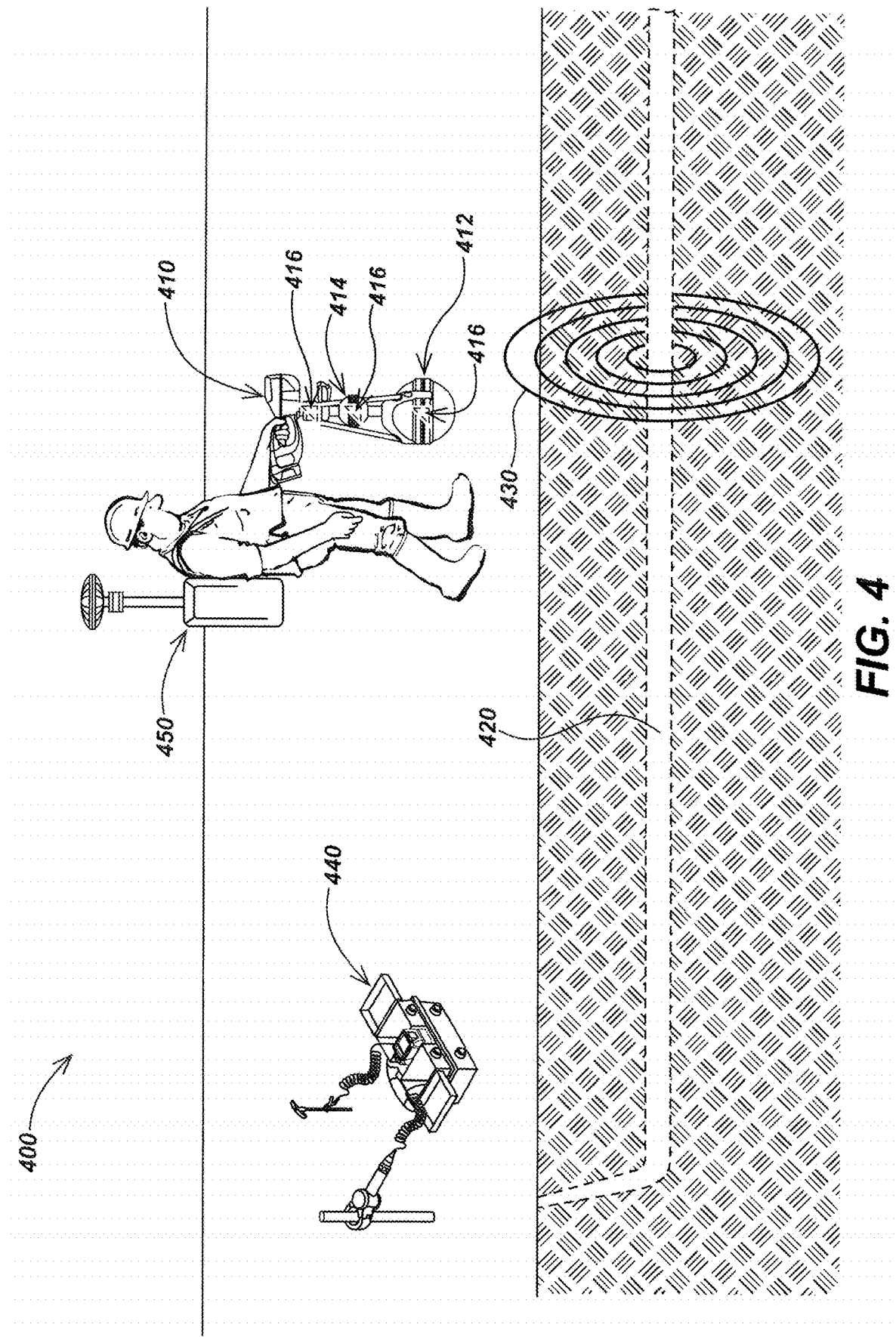
FIG. 4 is a utility locator system including multiple three-axis measurement module embodiments in a utility locator.

Turning to FIG. 4, an example utility locating system 400, including a measurement module embodiment in accordance with aspects of the disclosure, is shown. System 400 may include a utility locator 410, which may be of the variety described within the patents and patent applications incorporated by reference herein. The utility locator 410 may sense magnetic fields emitted from buried utilities or other sources and process the sensed magnetic fields to determine and map location, orientation, and depth of one or more utility lines within the ground, such as utility line 420. The magnetic fields may be received at antenna arrays 412 and 414, and the magnetic fields may result from signals 430 intentionally coupled to utility 420 from a transmitter device 440 (transmitter device 440 generates current output signals at one or more frequencies that are coupled to a utility to cause current flow in the utility, resulting in corresponding magnetic fields about the utility).

Utility locating system 400 may further include a GPS backpack device 450 which provides precision positioning information of the locator's user and the locator itself. An example GPS backpack device embodiment is described in the incorporated patents and patent applications. The exemplary GPS backpack provides geospatial location information as the utility locator 410 is moved about a locate area. In some system embodiments, such as in utility locator system 400, inertial navigation and/or other sensors for measuring along three axes may be included, such as the multiple three-axis sensor module 416 located within the mast of the utility locator 410 as shown in FIG. 4.

In applications wherein the x, y, and z measurements of the three-axis sensor module are determined using the example equations described previously herein and are used with intent to coincide in location with other device measurements, there may be a physical offset value or values between the measurement collected by the one or more three-axis measurement modules and the measurement location(s) of the other measurement device. For example, the physical offset between the three-axis sensor modules 416 of utility locator 410 in FIG. 4 and the measurement locations of antenna nodes 412 and/or 414 may be calculated and applied to the x, y, and z measurements gathered by the three-axis sensor modules 416, resulting in offset x, y, and z measurements compensating for physical differences in measurement locations.

Figure 5:
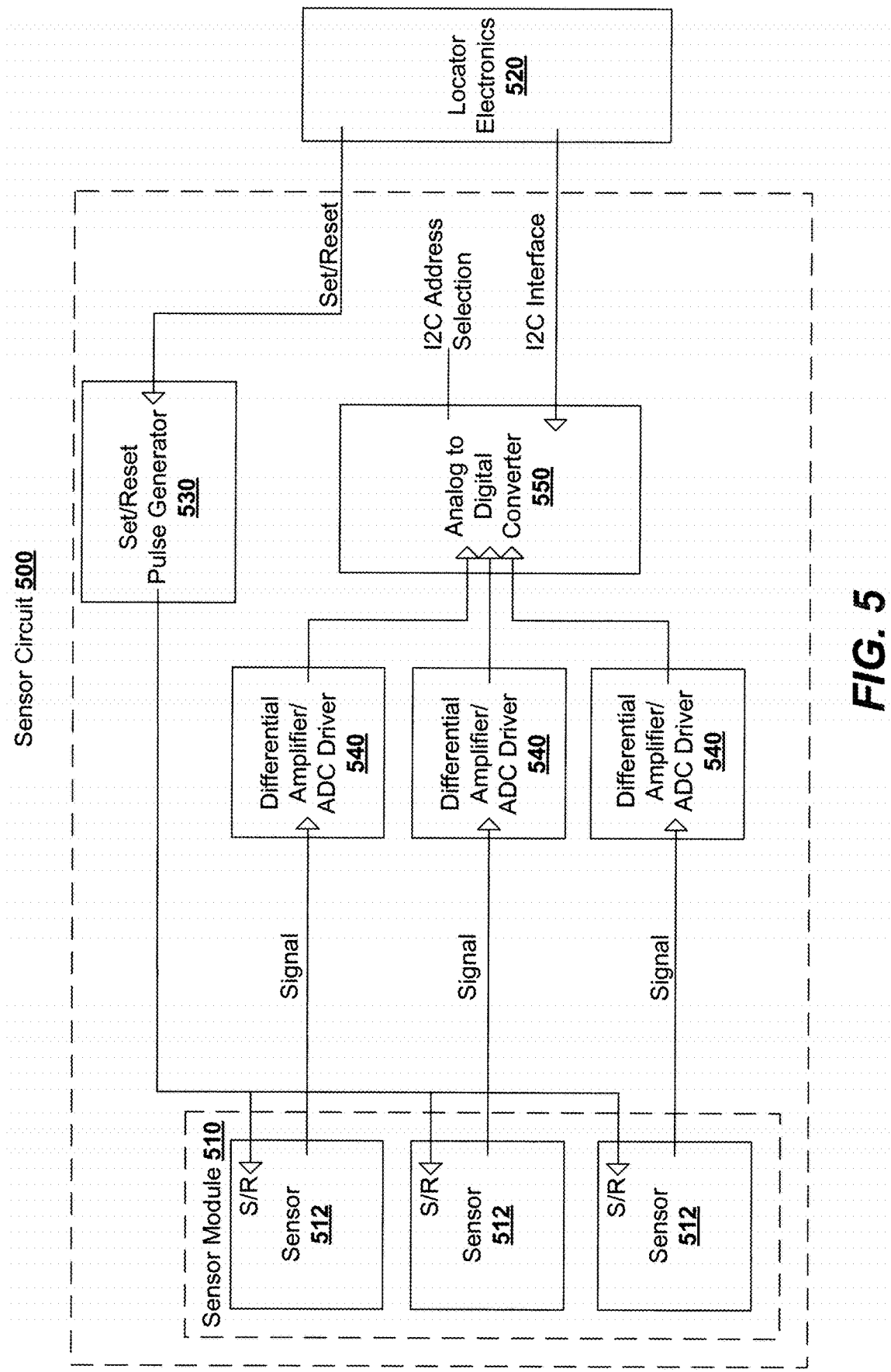
FIG. 5 is an exemplary diagram describing the circuit for use with a three-axis measurement module within a utility locator.

Turning to FIG. 5, details of an exemplary sensor circuit embodiment 500 for receiving and processing sensor output are shown in block diagram form. Circuit 500 includes a three-axis measurement module used in a magnetic field sensing utility locator (also denoted as a "buried utility locator," "buried object locator," or simply "locator" for brevity), such as the utility locator 410 of FIG. 4. Sensor circuit 500 may include a sensor module 510 of multiple single axis sensors 512 such as described previously herein. The sensor circuit 500 may be disposed on a PCB, such as PCB 150 of FIG. 1D. The sensor module 510 may be the same as or similar to those described herein, such as the three-axis sensor module 100 of FIGS. 1A-1G. The sensors 512 may be as described previously herein with respect to the single-axis sensors 130 of FIG. 1A-1G or other sensors described herein. The sensor circuit 500 may be in a separate electronics module or system, or may be integrated within or otherwise operatively connected to locator electronics 520 such as, for example, those described in the patents and patent applications incorporated herein by reference. The locator electronics 520 may implement signal processing functions, may provide electrical power, and/or may store data provided from the sensor module(s) in one or more non-transitory memories.

Sensor circuit 500 may include a set/reset pulse generator circuit 530 to provide electrical set/reset signals to each sensor 512 in response to a desired set or reset condition. Output signals generated by sensors 512 may be coupled to differential amplifier/analog to digital converter drivers 540 within sensor circuit 500, and may further be provided to an analog to digital (A/D) converter 550 if the sensor data output is in analog form. An I2C interface circuit may be included between the locator electronics 520 and analog to digital converter 550.

Turning to FIGS. 6A-6D, a dual three-axis measurement module embodiment 600 is illustrated. Module 600 includes two individual three-axis measurement module embodiments 610 mounted on opposite sides of a common PCB 620 functioning as a mounting substrate. Other dual measurement module embodiments may position sensor modules similarly using other mounting substrates that include, for example, one or more PCBs or other mounting substrates or holders for the sensor modules.

Figure 6A:
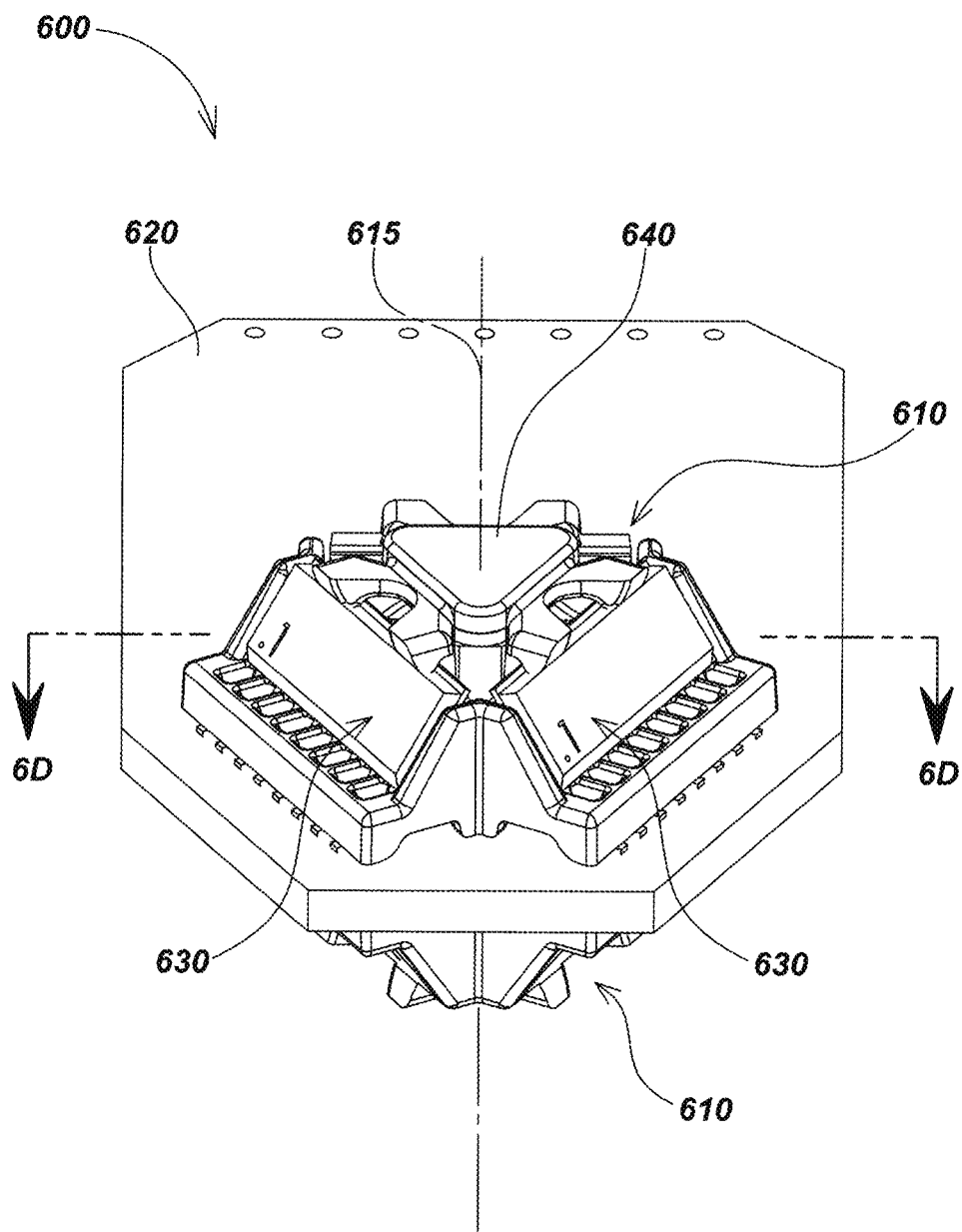
FIG. 6A is a dual three-axis measurement module embodiment having dual three-axis measurement modules.
Figure 6B:
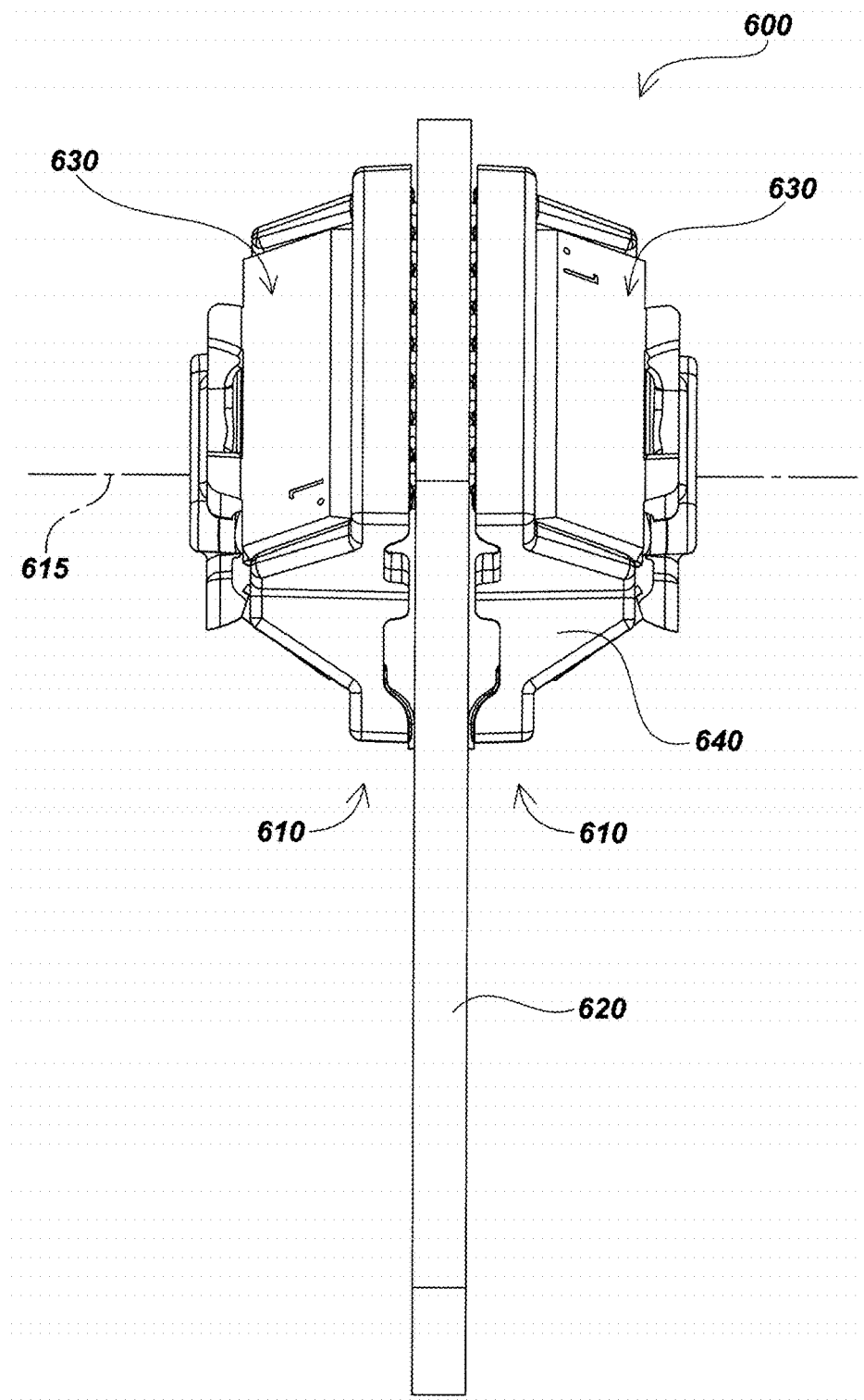
FIG. 6B is a side view of the dual three-axis measurement module embodiment from FIG. 6A.
Figure 6C:
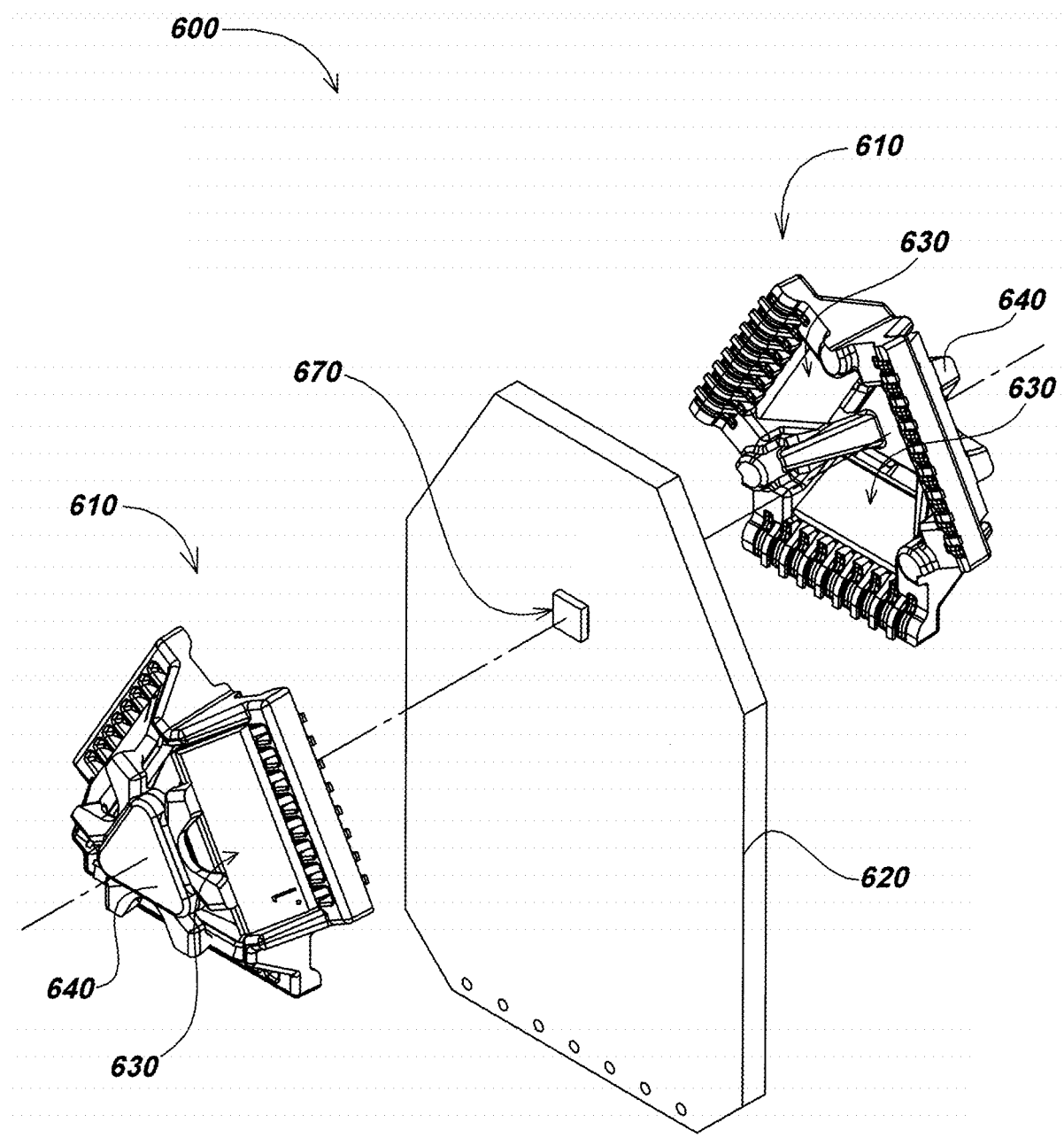
FIG. 6C is a partially exploded view of the dual three-axis measurement module embodiment from FIG. 6A.

In an exemplary embodiment, the first three-axis measurement module 610 of the pair may be positioned in alignment with the second module 610 on opposite sides of PCB 620, with axis 615 running through their measurement spatial positions as shown in FIG. 6A (i.e., with a vertical Z-axis, the measurement point or centroid of each module 610 is intersected by the Z-axis). Measurement module 600 and its individual three-axis measurement modules 610 may be the same or similar type or may share various aspects of measurement module 100 of FIGS. 1A-1G, measurement module 220 of FIGS. 2C-2E, and/or other three-axis measurement modules known or developed in the art.

Figure 6D:
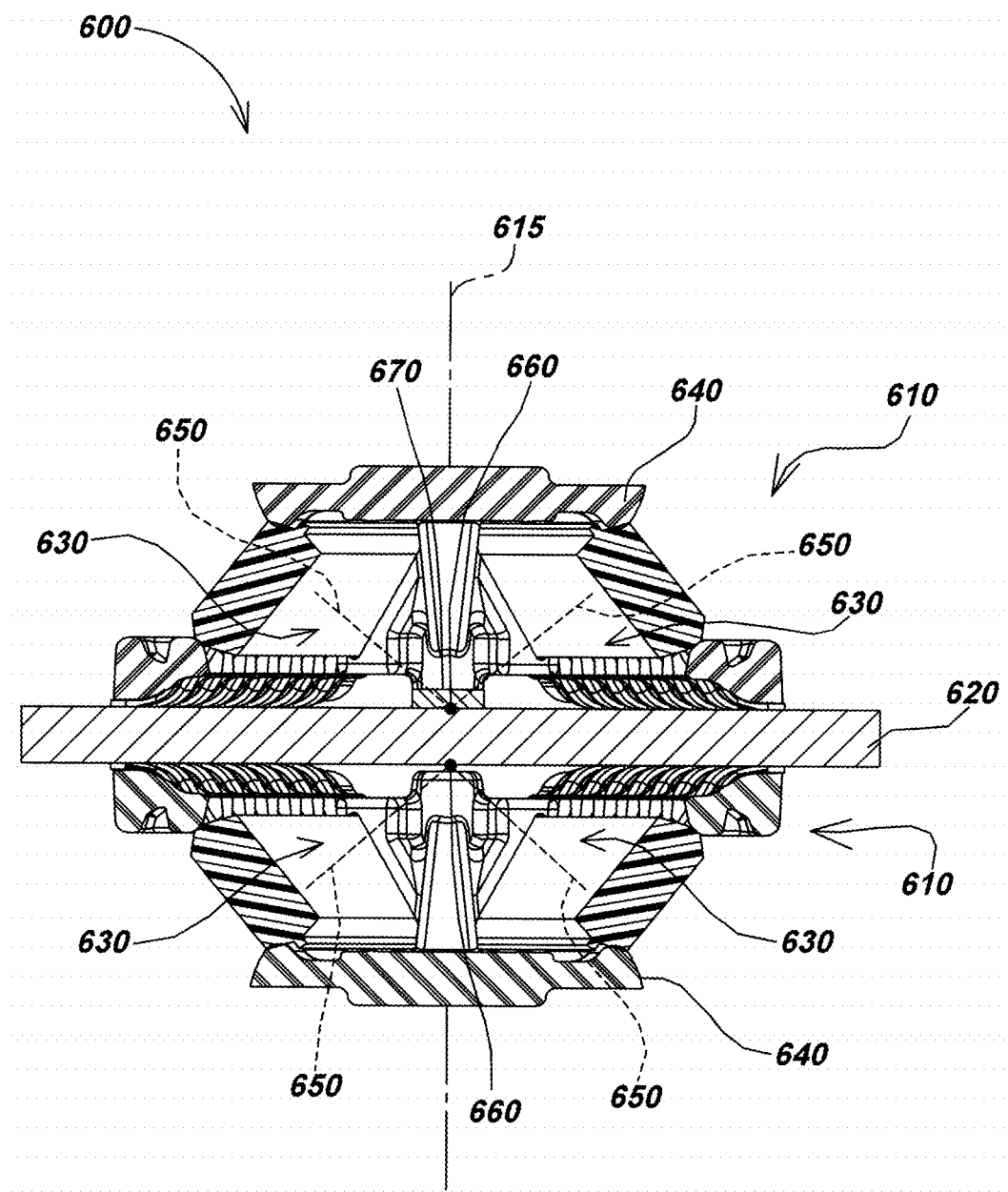
FIG. 6D is a section view of the dual three-axis measurement module embodiment from FIG. 6A along line 6D-6D.

Each individual three-axis measurement module 610 may have three single-axis sensors 630 retained and positioned within a mounting element 640 in a predefined three-dimensional spatial orientation. The mounting element 640 may position each single-axis sensor 630 to measure along measurement axes 650 (as shown in FIG. 6D) such that each measurement axis 650 on the same three-axis measurement module 610 intersects at an intersection point 660 along axis 615. Each measurement axis 650 at each individual three-axis measurement module 610 may be orthogonal to the measurement axes 650 on the same three-axis measurement module 610.

Similarly, the two individual three-axis measurement modules 610 and single-axis sensors 630 and measurement axes 650 thereof may be positioned in alignment with one another on opposite sides of PCB 620. The dual three-axis measurement module embodiment 600 may further include one or more temperature sensors 670 positioned at or near an intersection point 660 on either or both sides of the PCB 630.

In other dual three-axis measurement module embodiments, the three-axis measurement modules and single-axis sensors and measurement axes need not align on opposite sides of the common mounting substrate, such as PCB 720. Other dual measurement module embodiments may position sensor modules similarly using other mounting substrates that include, for example, one or more PCBs, plastic/polymer bases, metallic bases, ceramic bases, or other mounting substrates or holders for the sensor modules.

As illustrated in the exemplary embodiment of FIGS. 7A-7D, a dual three-axis measurement module embodiment 700 has two individual three-axis measurement modules 710 on opposite sides of the same mounting substrate, PCB 720. Unlike embodiment 600, the individual three-axis measurement modules 710 may be rotated to positions out of alignment on either side of the PCB 720 mounting substrate about an axis 715.

Figure 7A:
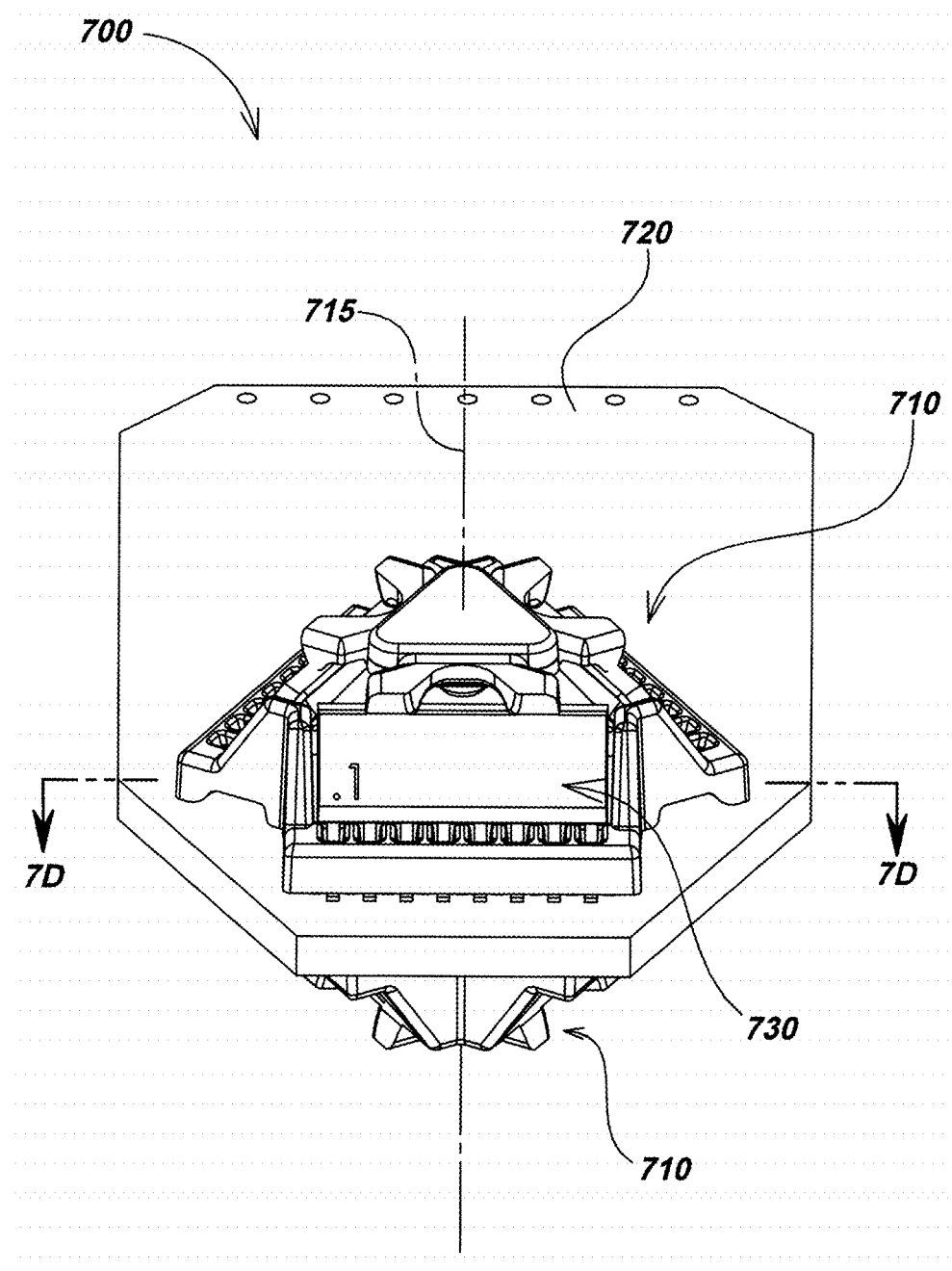
FIG. 7A is a dual three-axis measurement module embodiment having dual three-axis measurement modules.
Figure 7B:
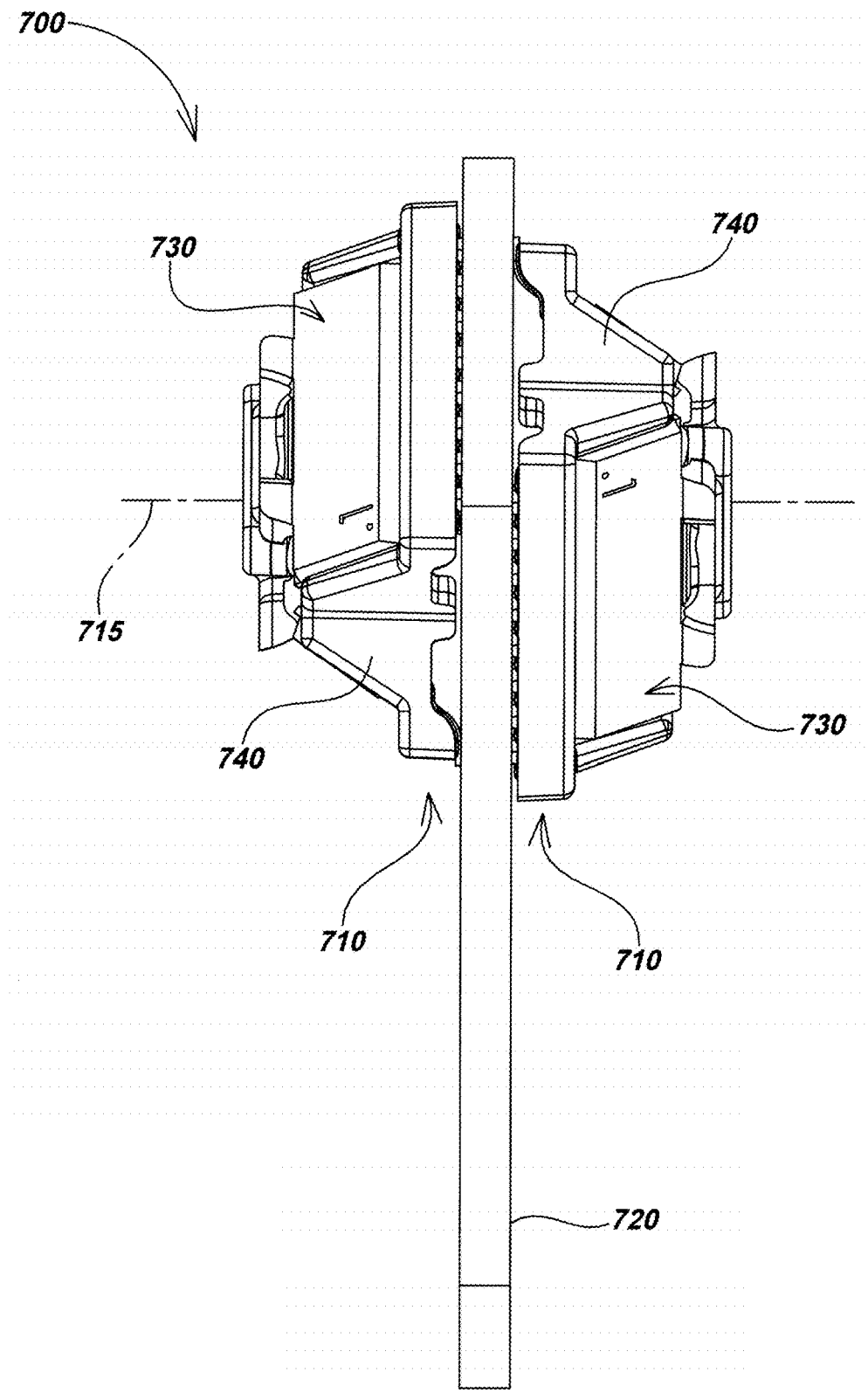
FIG. 7B is a side view of the dual three-axis measurement module embodiment from FIG. 7A.
Figure 7C:
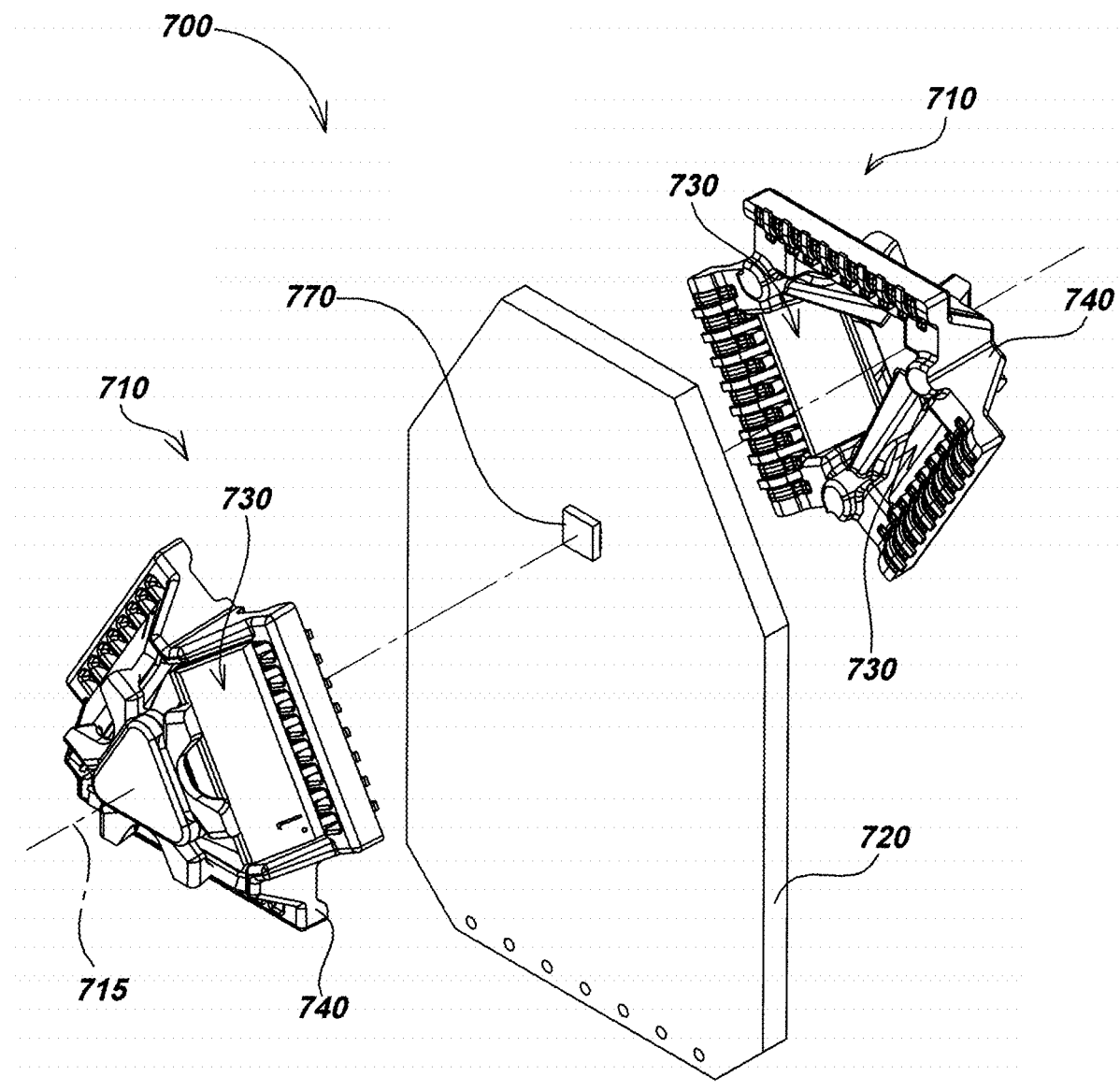
FIG. 7C is a partially exploded view of the dual three-axis measurement module embodiment from FIG. 7A.
Figure 7D:
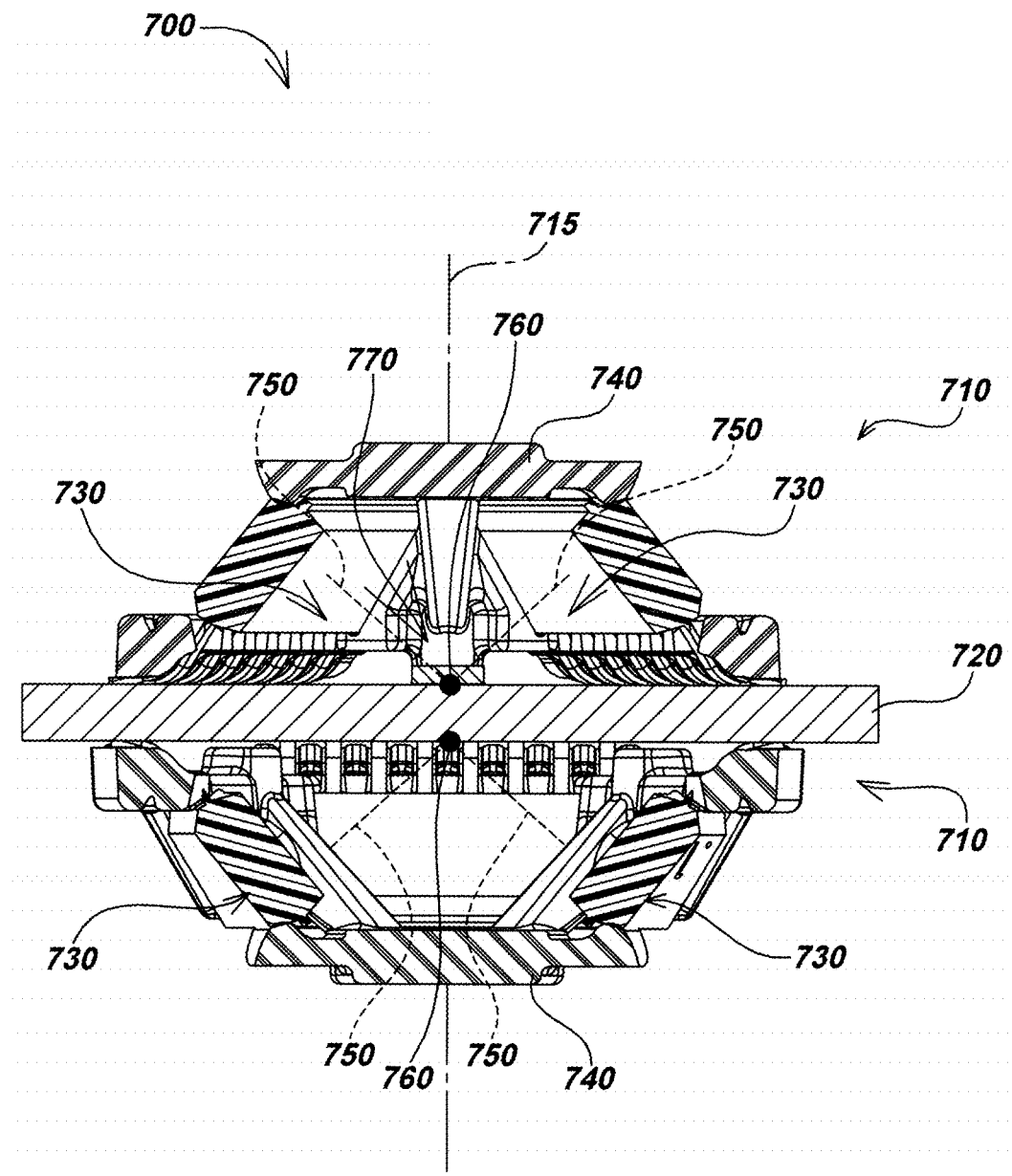
FIG. 7D is a section view of the dual three-axis measurement module embodiment from FIG. 7A along line 7D-7D.

For example, the individual three-axis measurement modules 710 may be positioned about axis 715 such that each three-axis measurement module 710, and single-axis sensors 730 retained and oriented within mounting element 740 thereof, measure along three measurement axes 750 (as shown in FIG. 7D) that are unaligned with those of the other individual three-axis measurement module 710. In an exemplary embodiment, the measurement axes 750 of one three-axis measurement module 710 may be rotated sixty degrees about axis 715 relative to the measurement axes 750 of the three-axis measurement module 710 on the opposite side of PCB 720, thereby bisecting the alignment position of the measurement axes 750 thereof.

Each individual three-axis measurement module 710 of dual three-axis measurement module 700 may be of the same or similar type, or share aspects with, the three-axis measurement module 100 of FIGS. 1A-1G, three-axis measurement module 220 of FIG. 2C-2E, or other three-axis measurement modules. It is noted that in some embodiments each single-axis sensors 730 may be oriented with the mounting element 740 to measure along measurement axes 750 (as shown in FIG. 7D) of each single-axis sensor 730 which may be orthogonal to the measurement axes 750 of single-axis sensors 730 on the same individual three-axis measurement modules 710 and intersect at an intersection point 760 aligned along axis 715. The dual three-axis measurement module embodiment 700 may further include one or more temperature sensors 770 (as shown in FIGS. 7C and 7D) at or near an intersection point 760 on either or both sides of the PCB 730.

In some configurations, the methods, apparatus, or systems described herein may include or describe means for implementing features or providing functions described herein. In one aspect, the aforementioned means may be a module including a processing element or elements comprising a processor or processors, associated memory for storing data and/or programming instructions, and/or other electronics in which embodiments of the invention reside, such as to implement magnetic sensor data signal processing for compensation or adjustment, or other functions related to magnetic sensors and sensing applications, or to provide other electronic or computer processing functions described herein. These may be, for example, modules or apparatus residing in utility locator devices or associated equipment, video camera systems and associated equipment and devices, electronic test and measurement equipment, consumer electronic devices, or other electronic systems or devices.

In one or more exemplary embodiments, the various functions, methods, and processes described herein for use with user interface devices and associated electronic computing systems may be implemented in hardware, software, firmware, or any combination thereof in one or more processing modules. If implemented in software, the functions may be stored on or encoded as one or more instructions or code on a non-transitory computer-readable medium.

Computer-readable media includes computer storage media. Storage media may be any available non-transitory storage media that can be accessed by a computer, microcontroller, microprocessor, DSP, FPGA, ASIC, or other programmable device. By way of example, and not limitation, such computer-readable media can comprise RAM, ROM, EEPROM, FLASH, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, computer program products comprising computer-readable media include all forms of computer-readable medium except, to the extent that such media is deemed to be non-statutory, transitory propagating signals. Computer program products may include instructions for causing a processing element or module, such as a microcontroller, microprocessor, DSP, ASIC, FPGA, or other programmable devices and associated memory to execute all or some of the stages of processes such as those described herein.

It is understood that the specific order or hierarchy of steps or stages in the signal processing methods described herein are examples of exemplary approaches. Based upon design preferences, it is understood that the specific order or hierarchy of steps in the processes may be rearranged, added to, deleted from, and/or amended while remaining within the spirit and scope of the present disclosure.

Those of skill in the art would understand that information and signals, such as sensor signals or data, video and/or audio signals or data, control signals, or other signals or data may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof transmitted through corresponding transmission media such as electrical conductors, waveguides, optical fibers, or other signal communications media.

Those of skill would further appreciate that the various illustrative logical blocks, modules, circuits, elements, and algorithm steps described in connection with the embodiments disclosed herein may be implemented as electronic hardware, computer software, electro-mechanical components, or combinations thereof. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative functions and circuits described in connection with the embodiments disclosed herein with respect to magnetic sensor signal processing and associated functionality may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps or stages of a method, process or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a magnetic user interface device, computer, or other electronic system or electronic computing device.

Reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the disclosure is not intended to be limited solely to the aspects shown herein but is to be accorded the widest scope consistent with the appended claims and their equivalents.

We claim:

1. A measurement module for use in a utility locator, comprising:
    a substrate;
    three or more single-axis integrated circuit magnetic field sensors for providing magnetic field output measurement signals;
    a mounting element disposed on the substrate, the mounting element including sensor retaining elements that position the single-axis sensors in a predefined pattern to provide the magnetic field output measurement signals to the utility locator;
    a plurality of electrical power terminals for receiving power at the measurement module from the utility locator to power the single-axis sensors;
    a temperature sensor for providing temperature output data usable to compensate for temperature variations in the single-axis sensor measurements, wherein the temperature sensor is positioned in close proximity to a measurement point or centroid shared by the single-axis sensors; and
    a plurality of signal terminals for receiving incoming signals at the measurement module from the utility locator and sending the magnetic field output signals from the single-axis sensors to the utility locator.

2. The module of claim 1, wherein the single-axis sensors are Honeywell HMC 1001 compass sensors or their equivalent.

3. The module of claim 1, wherein the sensor retaining elements include angled platforms to support ones of the sensors.

4. The module of claim 1, wherein the substrate is a printed circuit board (PCB) and pins of the single-axis sensors are soldered to the PCB to provide the signal and electrical terminals.

5. The module of claim 4, wherein the PCB is a planar PCB.

6. The module of claim 4, wherein the PCB is a non-planar three-dimensional PCB.

7. The module of claim 1, wherein the substrate comprises a metallic material.

8. The module of claim 1, wherein the substrate comprises a plastic or fiberglass material.

9. The module of claim 1, wherein the single-axis sensors are of the same make and model.

10. The module of claim 1, wherein one of the single axis sensors is different than another of the single-axis sensors in make and/or model.

11. The module of claim 1, wherein the single-axis sensors are compass sensors.

12. The module of claim 1, wherein the single-axis sensors are magnetometers.

13. The module of claim 1, wherein the single-axis sensors are accelerometers.

14. The module of claim 1, wherein the single-axis sensors are gyroscopic sensors.

15. The module of claim 1, wherein the single-axis sensors are tilt sensors.

16. The module of claim 1, wherein the mounting element retains each single axis sensor in an orientation angled away from the common mounting plane where each sensor is oriented to measure along one of three orthogonal measurement axes that intersect at a common intersection point.

17. The module of claim 1, further including detecting soft and/or hard iron distortions in individual sensor outputs and providing distortion compensation.

18. A dual three-axis measurement module, comprising:
    a mounting substrate;
    a first three-axis measurement module positioned on the mounting substrate, the first measurement module including:
    a substrate;
    three single-axis sensors;
    a mounting element disposed on the substrate, the mounting element including three sensor retaining elements that position the single-axis sensors in a predefined pattern;
    electrical terminals for receiving power at the module;
    electrical conductors for providing power from the electrical terminals to the sensors;
    signal terminals for receiving signals at the module and/or sending signals from the module;
    signal conductors operatively coupled to the signal terminals to provide received and/or sent signals between the single-axis sensors and the signal terminals; and
    a second three-axis measurement module positioned on the mounting substrate on an opposite side to the positioning of the first three-axis measurement module, the second measurement module similarly including:
    a substrate;
    three single-axis sensors;
    a mounting element disposed on the substrate, the mounting element including three sensor retaining elements that position the single-axis sensors in a predefined pattern;
    electrical terminals for receiving power at the module;
    electrical conductors for providing power from the electrical terminals to the sensors;
    signal terminals for receiving signals at the module and/or sending signals from the module;
    signal conductors operatively coupled to the signal terminals to provide received and/or sent signals between the single-axis sensors and the signal terminals.

* * * * *